(12) United States Patent
Yoon et al.

(10) Patent No.: US 7,963,680 B2
(45) Date of Patent: Jun. 21, 2011

(54) LIGHT EMITTING DIODE AND LENS FOR THE SAME

(75) Inventors: Ju-Young Yoon, Suwon-si (KR); Gi-Cherl Kim, Yongin-si (KR); Jong-Seo Lee, Hwaseong-si (KR); Chun-Ho Song, Seoul (KR); Se-Ki Park, Suwon-si (KR); Sang-Gil Lee, Seoul (KR); Seock-Hwan Kang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/507,308

(22) Filed: Jul. 22, 2009

(65) Prior Publication Data
US 2009/0279312 A1 Nov. 12, 2009

Related U.S. Application Data

(62) Division of application No. 11/120,666, filed on May 3, 2005, now Pat. No. 7,572,036.

(30) Foreign Application Priority Data

Oct. 18, 2004 (KR) ................................. 2004-83146

(51) Int. Cl.
*F21V 5/00* (2006.01)
(52) U.S. Cl. ...................... 362/336; 359/366; 359/711
(58) Field of Classification Search .......... 362/331–336, 362/329, 338, 326, 317, 800; 313/512, 110–113, 313/501; 359/365, 366, 362, 708–719
See application file for complete search history.

(56) References Cited

U.S. PATENT DOCUMENTS

| | | | |
|---|---|---|---|
| 3,760,237 A | | 9/1973 | Jaffe |
| 3,821,590 A | * | 6/1974 | Kosman ........................ 313/499 |
| 4,698,730 A | | 10/1987 | Sakai et al. |
| 5,013,144 A | * | 5/1991 | Silverglate et al. ........... 359/709 |
| 5,335,157 A | | 8/1994 | Lyons |
| 5,485,317 A | | 1/1996 | Perissinotto et al. |
| 5,757,557 A | | 5/1998 | Medvedev et al. |

(Continued)

FOREIGN PATENT DOCUMENTS

EP 1122573 A1 3/2009

(Continued)

*Primary Examiner* — Julie A Shallenberger
(74) *Attorney, Agent, or Firm* — F. Chau & Associates LLC

(57) ABSTRACT

A lens for a light emitting diode is formed with a material having a refractive index of n, and the lens includes a base, a first curved circumferential surface extending from the base, a curved center-edge surface extending from the first curved circumferential surface, and a curved centermost surface extending from the curved center-edge surface. The base includes a groove for receiving a light emitting chip therein. In the lens, a distance from a center of the base to a point of the curved center-edge surface is always shorter than the radius of curvature for the point of the curved center-edge surface. The curved centermost surface has a concave shape with respect to the base. In addition, when an obtuse angle formed between a main axis of the lens and a tangent line of a point of the curved centermost surface is A1, and an acute angle formed between a straight line linking the center of the base to the point of the curved centermost surface and the main axis of the lens is A2, the lens satisfies the equation: $A1+A2<90+\sin^{-1}(1/n)$.

5 Claims, 17 Drawing Sheets

U.S. PATENT DOCUMENTS

| | | |
|---|---|---|
| 5,836,676 A * | 11/1998 | Ando et al. .................... 362/244 |
| 6,227,685 B1 | 5/2001 | McDermott |
| 6,547,423 B2 | 4/2003 | Marshall et al. |
| 6,607,286 B2 | 8/2003 | West et al. |
| 6,724,543 B1 * | 4/2004 | Chinniah et al. ............... 359/718 |
| 7,104,672 B2 | 9/2006 | Zhang |
| 7,153,000 B2 | 12/2006 | Park et al. |
| 2002/0080615 A1 | 6/2002 | Marshall et al. |
| 2003/0089914 A1 | 5/2003 | Chen |
| 2003/0189832 A1 * | 10/2003 | Rizkin et al. ................... 362/302 |
| 2004/0080835 A1 | 4/2004 | Chinniah et al. |
| 2004/0252390 A1 * | 12/2004 | Benitez et al. ................. 359/858 |
| 2005/0128761 A1 | 6/2005 | Wu |
| 2006/0018122 A1 * | 1/2006 | Negley .......................... 362/326 |

FOREIGN PATENT DOCUMENTS

| | | |
|---|---|---|
| EP | 1213773 A1 | 7/2009 |
| JP | S61-183005 U | 11/1986 |
| JP | 08-148722 | 6/1996 |
| JP | 08-287719 | 11/1996 |
| JP | 10-004215 | 1/1998 |
| JP | 10-082915 | 3/1998 |
| JP | 10-322521 | 12/1998 |
| JP | 11-154766 | 6/1999 |
| JP | 2000-068562 | 3/2000 |
| JP | 2001-044515 | 2/2001 |
| JP | 2001-148514 | 5/2001 |
| JP | 2001-156378 | 6/2001 |
| JP | 2002-185036 | 6/2002 |
| JP | 2003-016808 | 1/2003 |
| JP | 2003-124522 | 4/2003 |
| JP | 2004-039334 | 2/2004 |
| JP | 2004-281605 | 10/2004 |
| KR | 1020020080834 | 10/2002 |
| KR | 1020020095003 | 12/2002 |
| KR | 100405453 | 11/2003 |
| KR | 1020040010117 | 1/2004 |
| KR | 1020040024747 | 3/2004 |
| KR | 100440524 | 7/2004 |
| WO | WO 02097325 A1 | 12/2002 |

* cited by examiner

LIGHT EMITTING DIODE AND LENS FOR THE SAME

CROSS-REFERENCE TO RELATED APPLICATION

This application is a Divisional Application of U.S. patent application Ser. No. 11/120,666 filed on May 3, 2005, now U.S. Pat. No. 7,572,036 which claims priority to Korean Patent Application No. 10-2004-0083146, filed on Oct. 18, 2004, the disclosures of which are incorporated by reference herein in their entireties.

BACKGROUND OF THE INVENTION (a) Technical Field

The present disclosure relates to a light source for a display device.

(b) Discussion of the Related Art

Display devices used for image display such as in a television receiver or computer monitor are classified into a self-luminescence display and a light-receiving display requiring a separate light source. Light emitting diode (LED), electroluminescence (EL), vacuum fluorescent display (VFD), field emission display (FED), and plasma display panel (PDP) devices, etc., are included in the self-luminescence display device, while liquid crystal displays (LCDs), etc., are included in the light-receiving display devices.

The LCD includes, for example, a pair of panels individually having electrodes on their inner surfaces, and a dielectric anisotropy liquid crystal layer interposed between the panels. In the LCD, a variation of the voltage difference between the field generating electrodes, i.e., the variation in the strength of an electric field generated by the electrodes, changes the transmittance of the light passing through the LCD, and thus desired images are obtained by controlling the voltage difference between the electrodes.

In the LCD, a light may be a natural light or an artificial light emitted from a light source unit separately employed in the LCD.

A backlight device is a representative artificial light source device for the LCD. The backlight device utilizes light emitting diodes (LEDs) or fluorescent lamps such as cold cathode fluorescent lamps (CCFLs), external electrode fluorescent lamps (EEFLs), etc., as the light source.

The LED is eco-friendly since it does not use mercury (Hg) and it has stable characteristics. For these reasons, the LED is a preferred light source.

However, some problems may arise when the LED is used as a surface light source device. This is because the light rays emitted from the LED tend to condense to a narrow region.

SUMMARY OF THE INVENTION

According to an embodiment of the present invention, there is provided a lens comprising: a base; a first curved circumferential surface upwardly extending from the base; and a first curved central surface extending from the first curved circumferential surface, wherein a distance from the center of the base to a point of the first curved central surface is shorter than the radius of curvature for the corresponding point of the first curved central surface.

The lens further comprises a central hollow portion upwardly formed from the base. The central hollow portion is comprised of a second curved circumferential surface and a second curved central surface extending from the second curved circumferential surface, which are inner surfaces of the lens. In this lens, it is preferable that a distance from the center of the base to a point of the second curved central surface is longer than the radius of curvature for the corresponding point of the second curved central surface.

A boundary region of the second curved central surface and the second curved circumferential surface is preferably placed within about 20 degrees to about 50 degrees with respect to the center of the base. Also, a boundary region of the first curved central surface and the first curved circumferential surface is placed within 20 degrees to 50 degrees with respect to the center of the base.

In this lens, the base includes a groove for receiving a light emitting chip therein, and a distance from the center of the base to a point of the first curved circumferential surface is shorter than the radius of curvature for the corresponding point of the first curved circumferential surface.

According to another embodiment of the present invention, there is provided a lens which is formed with a material having a refractive index of n, and which comprises: a base; a first curved circumferential surface upwardly extending from the base; a curved center-edge surface extending from the first curved circumferential surface; and a curved centermost surface extending from the curved center-edge surface.

Here, it is preferable that a distance from a center of the base to a point of the curved center-edge surface is always shorter than the radius of curvature for the corresponding point of the curved center-edge surface.

The curved centermost surface has a concave shape with respect to the base.

Here, it is preferable that the lens is constructed to satisfy the following equation:

$$A1+A2<90+\sin^{-1}(1/n),$$

wherein A1 is an obtuse angle formed between a main axis of the lens and a tangent line of a point of the curved centermost surface, and A2 is an acute angle formed between a straight line linking the center of the base to the corresponding point of the curved centermost surface and the main axis of the lens.

The lens further comprises a central hollow portion upwardly formed from the base of the lens. The central hollow portion includes a second curved circumferential surface and a curved central surface extending from the second curved circumferential surface, which are inner surfaces of the lens.

Here, it is preferable that a distance from the center of the base to a point of the curved central surface is longer than the radius of curvature for the corresponding point of the curved central surface. When the main axis of the lens is intersected with a tangent line of a boundary point of the curved center-edge surface and the curved centermost surface, they are intersected at an angle of 90 degrees.

It is also preferable that a boundary region of the curved center-edge surface and the first curved circumferential surface may be placed within about 20 degrees to about 50 degrees with respect to the center of the base. The curved centermost surface may be a cone-shaped groove.

According to another embodiment of the present invention, there is provided an LED comprising: a first lens including a base, a first curved circumferential surface upwardly extending from the base, and a first curved central surface; and a light emitting chip provided under the first lens.

Here, it is preferable that a distance from a point of an upper surface of the light emitting chip to a point of the first curved central surface is shorter than the radius of curvature for the corresponding point of the first curved central surface.

The LED further comprises a central hollow portion upwardly formed from the base of the first lens. The central hollow portion includes a second curved circumferential surface and a second curved central surface extending from the second curved circumferential surface, which are inner surfaces of the first lens. Here, it is preferable that a distance from a point of an upper surface of the light emitting chip to a point of the second curved central surface is longer than the radius of curvature for the corresponding point of the second curved central surface.

The LED further comprises a second lens which is provided in the central hollow portion of the first lens to cover the light emitting chip. The second lens includes a base, a third curved circumferential surface upwardly extending from the base, and a third curved central curved extending from the third curved circumferential surface. In this lens, it is preferable that a distance from a point of an upper surface of the light emitting chip to a point of the third curved central surface is shorter than the radius of curvature for a corresponding point of the third curved central surface.

The LED further comprises a central hollow portion upwardly formed from the base of the second lens. The central hollow portion includes a fourth curved circumferential surface and a fourth curved central surface extending from the fourth curved circumferential surface, which are inner surfaces of the lens. In the second lens, it is preferable that a distance from a point of an upper surface of the light emitting chip to a point of the fourth curved central surface is longer than the radius of curvature for the corresponding point of the fourth curved central surface.

The second lens is formed with a material having a refractive index of n, and it includes a base, a fifth curved circumferential surface upwardly extending from the base, a curved center-edge surface extending from the fifth curved circumferential surface, and a curved centermost surface extending from the curved center-edge surface. A groove is formed at the center of the base for receiving the light emitting chip therein.

In the second lens, it is preferable that a distance from a point of an upper surface of the light emitting chip to a point of the curved center-edge surface is shorter than the radius of curvature for the corresponding point of the curved center-edge surface, and the curved centermost surface has a concave shape when viewed from the light emitting chip.

The LED further comprises a central hollow portion upwardly formed from the base of the second lens. The central hollow includes a sixth curved circumferential surface and a sixth curved central surface extending from the sixth curved circumferential surface, which are inner surfaces of the second lens. Here, it is preferable that a distance from a point of an upper surface of the light emitting chip to a point of the sixth curved central surface is longer than the radius of curvature for the corresponding point of the sixth curved central surface.

The LED further comprises a supporting unit which is attached to the base of the first lens for supporting the light emitting chip thereon.

According to another embodiment of the present invention, there is provided an LED comprised of: a first lens which is formed with a material having a refractive index of n, and the lens includes a base, a first curved circumferential surface upwardly extending from the base, a first curved center-edge surface extending from the first curved circumferential surface, and a first curved centermost surface extending from the first curved center-edge surface; and a light emitting chip which is provided under the first lens.

In this LED, a distance from a point of an upper surface of the light emitting chip to a point of the first curved center-edge surface is shorter than the radius of curvature for the corresponding point of the first curved center-edge surface. The first curved centermost surface has a concave shape when viewed from the light emitting chip.

Here, it is preferable that the LED is constructed to satisfy the following equation:

$$A1+A2<90+\sin^{-1}(1/n),$$

wherein A1 is an obtuse angle formed between the main axis of the first lens and a tangent line of a point of the first curved centermost surface, and A2 is an acute angle formed between a straight line linking the center of the base to the corresponding point of the first curved centermost surface and the main axis of the first lens.

The LED further comprises a central hollow portion upwardly formed from the base of the first lens. The central hollow portion includes a second curved circumferential surface and a first curved central surface extending from the second curved circumferential surface, which are inner surfaces of the first lens. Here, it is preferable that a distance from a point of an upper surface of the light emitting chip to a point of the first curved central surface is longer than the radius of curvature for the corresponding point of the first curved central surface.

The LED further comprises a second lens which is provided in the central hollow portion of the first lens to cover the light emitting chip. The second lens includes a base, a third curved circumferential surface upwardly extending from the base, and a second curved central surface extending from the third curved circumferential surface.

Here, it is preferable that a distance from a point of an upper surface of the light emitting chip to a point of the second curved central surface is shorter than the radius of curvature for the corresponding point of the second curved central surface.

The LED further comprises a central hollow portion upwardly formed from the base of the second lens. The central hollow portion includes a fourth curved circumferential surface and a third curved central surface extending from the fourth curved circumferential surface, which are inner surfaces of the second lens.

Here, it is also preferable that a distance from a point of an upper surface of the light emitting chip to a point of the third curved central surface is longer than the radius of curvature for the corresponding point of the third curved central surface.

The second lens is formed with a material having a refractive index of n, and the second lens includes a base, a fifth curved circumferential surface upwardly extending from the base, a second curved center-edge surface extending from the fifth curved circumferential surface, and a second curved centermost surface extending from the second curved center-edge surface.

Here, it is preferable that a distance from a point of an upper surface of the light emitting chip to a point of the second curved center-edge surface is shorter than the radius of curvature for the corresponding point of the second curved center-edge surface, and the second curved centermost surface has a concave shape when viewed from the light emitting chip.

The LED further comprises a central hollow portion upwardly formed from the base of the second lens. The central hollow portion is comprised of a sixth curved circumferential surface and a fourth curved central surface extending from the sixth curved circumferential surface, which are inner surfaces of the second lens.

Here, it is preferable that a distance from a point of an upper surface of the light emitting chip to a point of the fourth curved central surface is longer than the radius of curvature for the corresponding point of the fourth curved central surface.

The LED further comprises a supporting unit which is attached to the base of the first lens for supporting the light emitting chip thereon.

In this LED, the first curved centermost surface is a cone-shaped groove.

According to another embodiment of the present invention, there is provided an LED which comprises: a lens including a base, a first curved circumferential surface upwardly extending from the base, and a first curved central surface; and a light emitting chip provided under the lens.

In this LED, at least a partial area of the first curved central surface and the first curved circumferential surface includes an uneven pattern. Here, it is preferable that a distance from a point of an upper surface of the light emitting chip to a point of an outline of the first curved central surface is shorter than the radius of curvature for the corresponding point of the outline surface of the first curved central surface.

The LED further comprises a central hollow portion upwardly formed from the base of the lens. The central hollow portion includes a second curved circumferential surface and a second curved central surface extending from the second curved circumferential surface, which are inner surfaces of the lens. Here, it is preferable that a distance from a point of an upper surface of the light emitting chip to a point of the second curved central surface is longer than the radius of curvature for the corresponding point of the second curved central surface.

The LED further comprises an inner lens which is provided in the central hollow portion of the lens to cover the light emitting chip. The inner lens includes a base, a curved circumferential surface upwardly extending from the base, and a curved central surface extending from the curved circumferential surface.

Here, it is preferable that a distance from a point of an upper surface of the light emitting chip to a point of the curved central surface is shorter than the radius of curvature for the corresponding point of the curved central surface.

In the LED, the uneven pattern is formed at the boundary area of the first curved central surface and the first curved circumferential surface.

According to another embodiment of the present invention, there is provided an LED which comprises: a lens which is formed with a material having a refractive index of n, and it includes a base, a first curved circumferential surface upwardly extending from the base, a curved central-edge surface extending from the first curved circumferential surface, and a curved centermost surface extending from the curved central-edge surface; and a light emitting chip which is provided under the lens.

In the LED, at least a partial area of the curved centermost surface, the curved central-edge surface and the first curved circumferential surface includes an uneven pattern. Here, it is preferable that a distance from a point of an upper surface of the light emitting chip to a point of the curved central-edge surface is shorter than the radius of curvature for the corresponding point of an outline surface of the curved central-edge surface, and the curved centermost surface has a concave shape when viewed from the light emitting chip.

Here, it is preferable that the LED is constructed to satisfy the following equation:

$$A1+A2<90+\sin^{-1}(1/n),$$

wherein A1 is an obtuse angle formed between the main axis of the lens and a tangent line of a point of the curved centermost surface, and A2 is an acute angle formed between a straight line linking the center of the base to the corresponding point of the curved centermost surface and the main axis of the lens.

The LED further comprises a central hollow portion upwardly formed from the base of the lens. The central hollow portion includes a second curved circumferential surface and a curved central surface upwardly extending from the second curved circumferential surface, which are inner surfaces of the lens.

Here, it is preferable that a distance from a point of an upper surface of the light emitting chip to a point of the curved central surface is longer than the radius of curvature for the corresponding point of the curved central surface.

The LED further comprises an inner lens which is provided in the central hollow portion of the lens to cover the light emitting chip. The inner lens includes a base, a curved circumferential surface upwardly extending from the base, and a curved central surface extending from the curved circumferential surface. Here, it is preferable that a distance from a point of an upper surface of the light emitting chip to a point of the curved central surface is shorter than the radius of curvature for the corresponding point of the curved central surface.

In the LED, the uneven pattern may be formed at the boundary area of the curved centermost surface and the curved center-edge surface and the boundary area of the curved center-edge surface and the first curved circumferential surface. The curved centermost surface may be a cone-shaped groove.

According to another embodiment of the present invention, there is provided an LED which comprises a lens including a base, a first curved circumferential surface upwardly extending from the base, and a first curved central surface.

In this LED, an acute angle formed between a straight line linking the center of the base to a point of the first curved central surface and the main axis of the lens is larger than an acute angle formed between the normal for the corresponding point of the first curved surface and the main axis of the lens.

The LED further comprises a central hollow portion upwardly formed from the base of the lens. The central hollow portion is comprised of a second curved circumferential surface and a second curved central surface extending from the second curved circumferential surface, which are inner surfaces of the lens.

Here, it is preferable that an acute angle formed between a straight line linking the center of the base to a point of the second curved central surface and the main axis of the lens is smaller than an acute angle formed between the normal for the corresponding point of the second curved central surface and the main axis of the lens.

According to another embodiment of the present invention, there is provided a lens for an LED, which is formed with a material having a refractive index of n, and is comprised of: a base; a first curved circumferential surface upwardly extending from the base; a curved center-edge surface extending from the first curved circumferential surface; and a curved centermost surface extending from the curved central-edge surface.

Here, it is preferable that an acute angle formed between a straight line linking the center of the base to a point of the curved center-edge surface and the main axis of the lens is larger than an acute angle formed between the normal for the corresponding point of the curved center-edge surface and the main axis of the lens, and the curved centermost surface has a concave shape when viewed from the base.

Here, it is preferable that the lens is constructed to satisfy the following equation:

A1+A2<90+sin$^{-1}$(1/n), wherein A1 is an obtuse angle formed between the main axis of the lens and a tangent line of a point of the curved centermost surface, and A2 is an acute angle formed between a straight line linking the center of the base to the corresponding point of the curved centermost surface and the main axis of the lens.

The lens further comprises a central hollow portion upwardly formed from the base of the lens. The central hollow portion is comprised of a second curved circumferential surface and a curved central surface extending from the second curved circumferential surface, which are inner surfaces of the lens.

Here, it is preferable that an acute angle formed between a straight line linking the center of the base to a point of the curved central surface and the main axis of the lens is smaller than an acute angle formed between the normal for the corresponding point of the curved central surface and the main axis of the lens.

According to another embodiment of the present invention, a lens for a light emitting diode comprises a base, a first curved surface extending from the base, and a second curved surface extending from the first curved surface, wherein a distance from a center of the base to a point of the second curved surface is shorter than a radius of curvature for the point of the first curved central surface.

The lens may include a hollow portion formed from the base, wherein the hollow portion is comprised of a third curved surface and a fourth curved surface extending from the third curved surface, and wherein a distance from the center of the base to a point of the fourth curved surface is longer than the radius of curvature for the point of the fourth curved surface.

BRIEF DESCRIPTION OF THE DRAWINGS

Preferred embodiments of the present invention can be understood in more detail from the following descriptions taken in conjunction with the accompanying drawings in which.

DETAILED DESCRIPTION OF THE PREFERRED EMBODIMENTS

Figure 1:
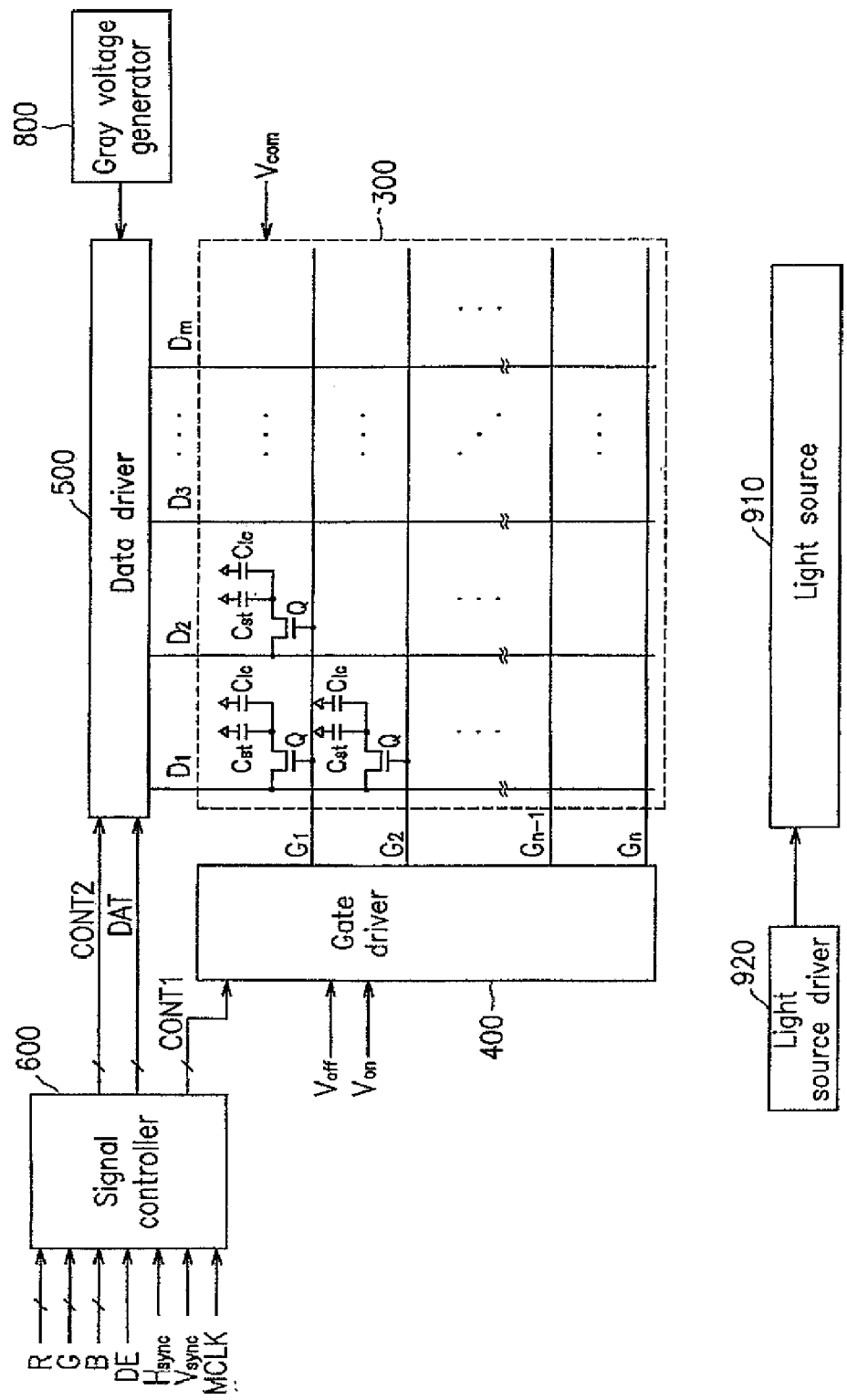
FIG. 1 is a block diagram of an LCD according to an embodiment of the present invention.

Preferred embodiments of the present invention will now be described more fully hereinafter with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of the layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Hereinafter, a light source device for a display device according to preferred embodiments of the present invention will be described in detail with reference to the accompanying drawings.

Figure 2:
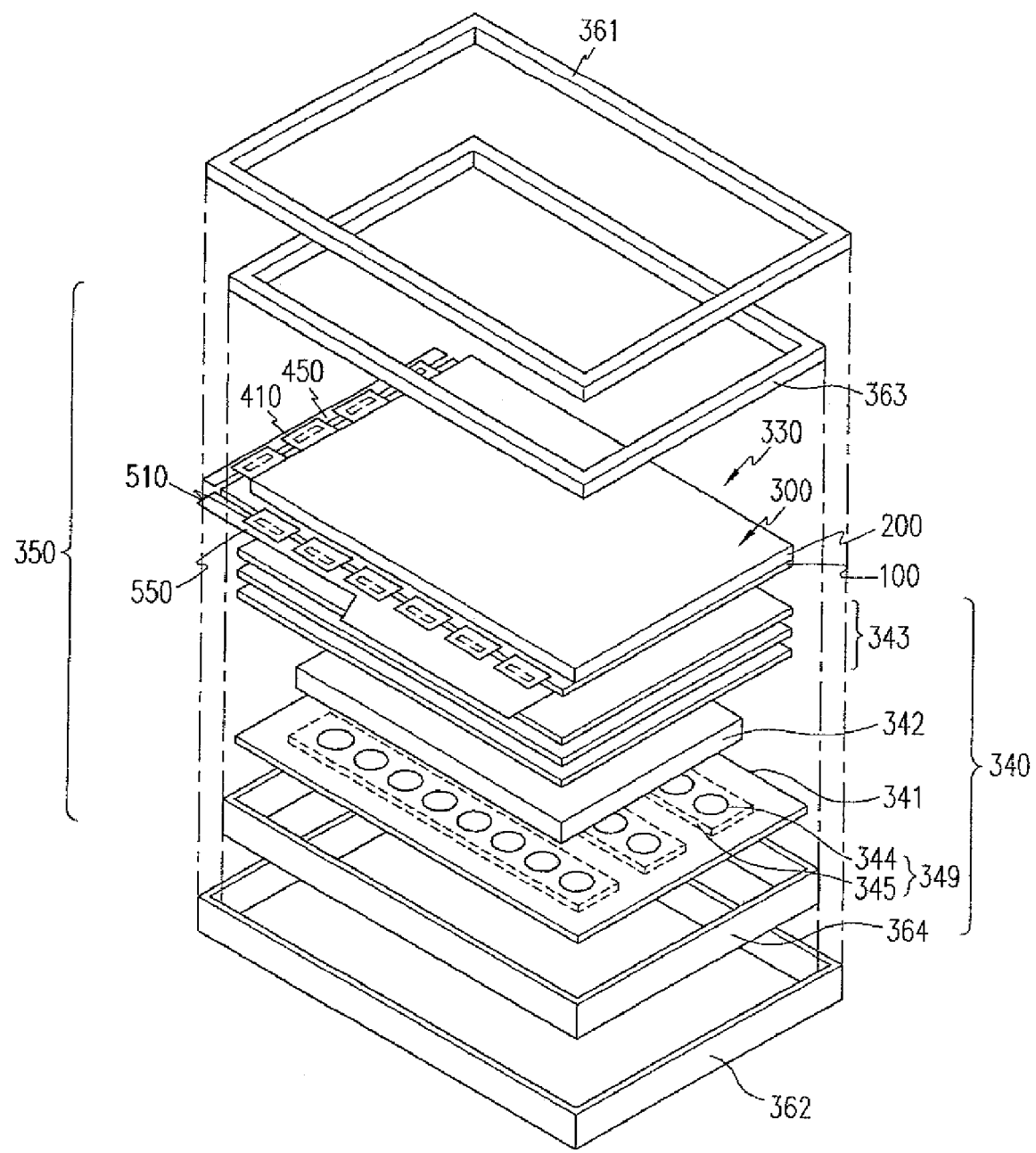
FIG. 2 is an exploded perspective view schematically illustrating an LCD according to an embodiment of the present invention.
Figure 3:
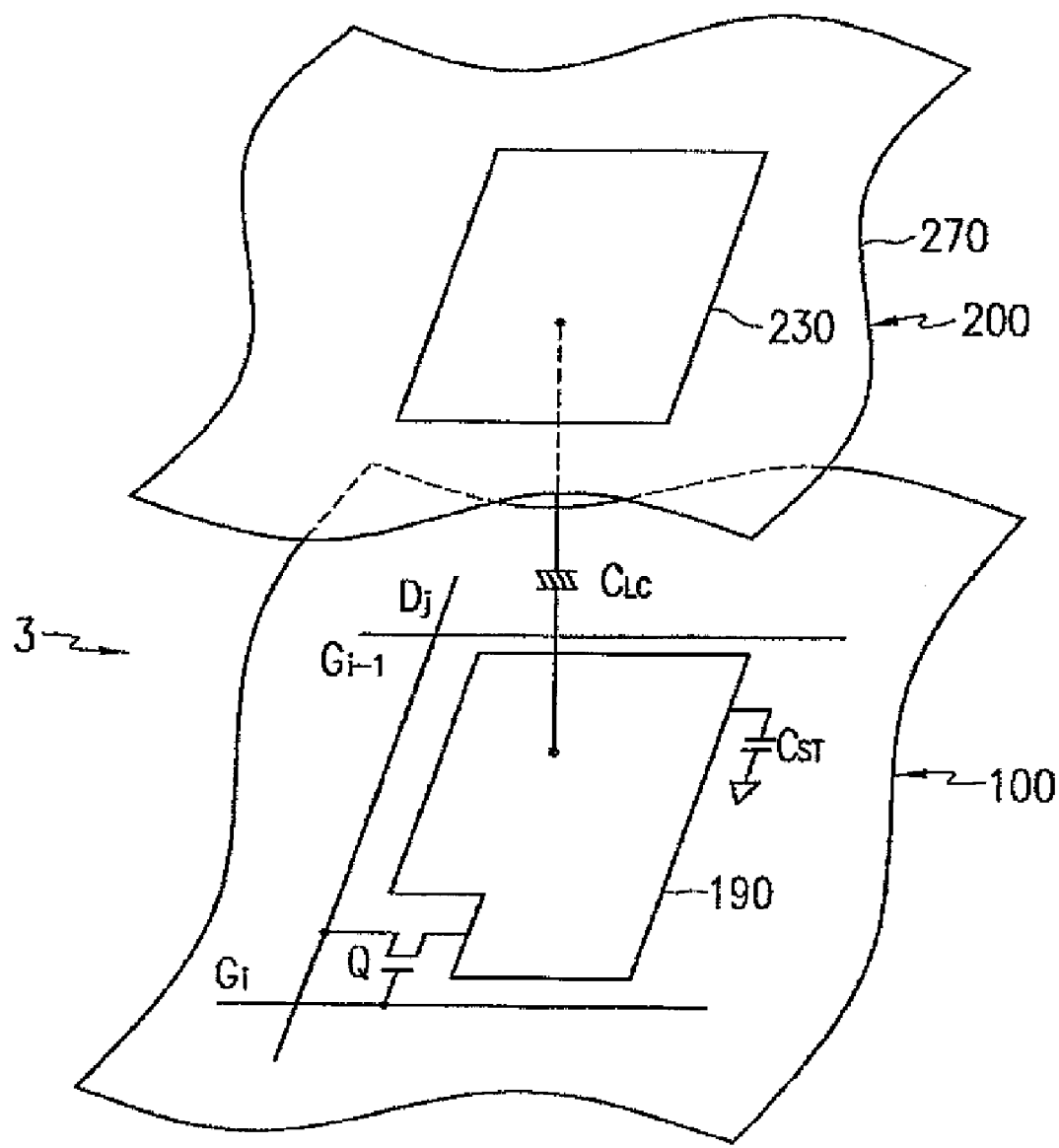
FIG. 3 is an equivalent circuit view of a pixel unit of an LCD according to an embodiment of the present invention.

FIG. 1 is a block diagram of an LCD according to an embodiment of the present invention, FIG. 2 is an exploded perspective view schematically illustrating an LCD according to an embodiment of the present invention, and FIG. 3 is an equivalent circuit view of pixel unit of an LCD according to an embodiment of the present invention.

Referring to FIG. 1, an LCD according to an embodiment of the present invention comprises an LC panel assembly 300, a gate driver 400 and a data driver 500 which are connected to the LC panel assembly 300, a gray voltage generator 800 connected to the data driver 400, a light source section 910 for supplying light to the LC panel assembly 300, a light source driver 920 for controlling the light source section 910, and a signal controller 600 for controlling the above elements.

Referring to FIG. 2, the LCD configuration according to an embodiment of the present invention comprises an LC module 350 including a display unit 330 and a back light 340, a front housing 361 and a rear housing 362 for receiving and supporting the LC module 350, and mold frames 363 and 364.

The display unit 330 includes the LC panel assembly 300, a gate tape carrier package (TCP) 410 and a data TCP 510 which are attached to the LC panel assembly 300, and a gate printed circuit board (PCB) 450 and a data PCB 550 which are individually attached to the corresponding TCPs 410 and 510.

In a structural view shown in FIG. 2 and FIG. 3, the LC panel assembly 300 includes a lower panel 100 and an upper panel 200 facing each other, and an LC layer 3 interposed therebetween. In an equivalent circuit shown in FIG. 1 and FIG. 3, the LC panel assembly 300 includes a plurality of display signal lines $G_1$-$G_n$ and $D_1$-$D_m$ and a plurality of pixels connected thereto and arranged substantially in a matrix.

The display signal lines $G_1$-$G_n$ and $D_1$-$D_m$ are provided on the lower panel 100 and include a plurality of gate lines $G_1$-$G_n$, for transmitting gate signals (also referred to as "scanning signals"), and a plurality of data lines $D_1$-$D_m$ for transmitting data signals. The gate lines $G_1$-$G_n$ extend substantially in a row direction and substantially parallel to each other, while the data lines $D_1$-$D_m$ extend substantially in a column direction and substantially parallel to each other.

Each pixel includes a switching element Q which are connected to the display signal lines $G_1$-$G_n$ and $D_1$-$D_m$, and an LC capacitor $C_{LC}$ and a storage capacitor $C_{ST}$ which are connected to the switching element Q. The storage capacitor $C_{ST}$ may be omitted.

The switching element Q such as a thin film transistor (TFT) is provided on the lower panel 100 and has three terminals: a control terminal connected to one of the gate lines $G_1$-$G_n$; an input terminal connected to one of the data lines $D_1$-$D_m$; and an output terminal connected to both of the LC capacitor $C_{LC}$ and the storage capacitor $C_{ST}$.

The LC capacitor $C_{LC}$ includes a pixel electrode 190 provided on the lower panel 100 and a common electrode 270 provided on the upper panel 200 as two terminals. The LC layer 3 interposed between the two electrodes 190 and 270 functions as a dielectric for the LC capacitor $C_{LC}$. The pixel electrode 190 is connected to the switching element Q, and the common electrode 270 is supplied with a common voltage $V_{com}$ and covers the entire surface of the upper panel 200. Alternatively, the common electrode 270 may be provided on the lower panel 100. At least one of the pixel electrode 190 and the common electrode 270 may be shaped as a bar or a stripe.

The storage capacitor $C_{ST}$ is an auxiliary capacitor for the LC capacitor $C_{LC}$. When the pixel electrode 190 and a separate signal line (not shown) which is provided on the lower panel 100 are overlapped with each other, interposing an insulator therebetween, the overlapped portion becomes the storage capacitor $C_{ST}$. The separate signal line is supplied with a predetermined voltage such as the common voltage $V_{com}$. Alternatively, the storage capacitor $C_{ST}$ may be formed by overlapping of the separate signal line with a pixel electrode of the previous gate line which is placed directly before the pixel electrode 190, and interposing an insulator therebetween.

For color display, each pixel uniquely exhibits one of three primary colors (i.e., spatial division), or sequentially exhibits three primary colors in turn depending on time (i.e., temporal division), so that a spatial or temporal sum of the primary colors are recognized as a desired color. FIG. 3 shows an example of the spatial division in which each pixel includes a color filter 230 for exhibiting one of the primary colors in an area of the upper panel 200 corresponding to the pixel electrode 190. Alternatively, the color filter 230 may be provided on or under the pixel electrode 190 of the lower panel 100.

Referring to FIG. 2, the backlight 340 is mounted under the LC panel assembly 300. The backlight 340 comprises a light source unit 349 including a printed circuit board (PCB) 345 and a plurality of light emitting diodes (LEDs) 344 mounted thereon, and a light guiding plate 342 and a plurality of optical sheets 343 which are provided between the LC panel assembly 300 and the LEDs 344 for dispersing the light from the LEDs 344 to the LC panel assembly 300. The backlight 340 further comprises a reflecting plate 341 which is provided on the PCB 345 for reflecting the light from the LEDs 344 toward the LC panel assembly 300, and includes a plurality of holes where light emitting chips of the LEDs 344 are protruded therethrough. The backlight 340 further comprises a mold frame 364 which is provided between the reflecting plate 341 and the light guiding plate 342 for maintaining a regular interval between the light source unit 349 and the light guiding plate 342 and for supporting the light guiding plate 342 and the optical sheets 343.

The LEDs 344 as the light source may be white light emitting diodes or a combination of red, green, and blue light emitting diodes. The red light emitting diode, etc. can be used as an auxiliary diode for the white light emitting diode. The LEDs 344 are arranged on the PCB 345 in a predetermined form, thereby forming the light source unit 349.

FIG. 2 shows three light source units 349, but the number of the light source units 349 can be varied depending on required brightness, screen size of the LCD, etc.

Polarizers (not shown) are provided on the outer surfaces of the two panels 100 and 200 for polarizing the light emitted from the light source units 349.

Referring to FIG. 1 and FIG. 2, the gray voltage generator 800 is included in the data PCB 550 and generates two sets of a plurality of gray voltages related to the transmittance of the pixels. The gray voltages in one set have a positive polarity with respect to the common voltage $V_{com}$, while those of the other set have a negative polarity with respect to the common voltage $V_{com}$.

The gate drivers 400 are individually mounted on each gate TCP 410, having the shapes of an integrated circuit (IC) chip, and are individually connected to the gate lines $G_1$-$G_n$ of the LC panel assembly 300 for transmitting the gate signals consisting of combinations of the gate-on voltage $V_{on}$ and the gate-off voltage $V_{off}$ input from an external device to the gate signal lines $G_1$-$G_n$.

The data drivers 500 are individually mounted on each data TCP 510, having the shapes of IC chips, and are individually connected to the data lines $D_1$-$D_m$ of the LC panel assembly 300 for transmitting the data voltages which are selected from the gray voltages supplied from the gray voltage generator 800 to the data signal lines $D_1$-$D_m$.

In another embodiment of the present invention, the gate driver 400 or the data driver 500 is directly mounted on the lower panel 100, having the shape of an IC chip, and in still another embodiment of the present invention, the gate driver 400 or the data driver 500 is integrated into the lower panel 100 along with other elements. In the above cases, the gate PCB 450 or the gate TCP 410 can be omitted.

The signal controller 600 is included in the data PCB 550 or the gate PCB 450 for controlling the operation of the gate driver 400 or the data driver 500.

Hereinafter, the operation of the above-mentioned LCD will be described.

The signal controller 600 receives input image signals R, G, and B and input control signals for controlling the display thereof such as a vertical synchronizing signal $V_{sync}$, a horizontal synchronizing signal $H_{sync}$, a main clock MCLK, a data enable signal DE, etc. from an external graphic controller (not shown). In response to the input image signals R, G, and B and the input control signals, the signal controller 600 processes the image signals R, G, and B suitably for the operation of the LC panel assembly 300 and generates gate control signals CONT1 and data control signals CONT2, and then outputs the gate control signals CONT1 and the data control signals CONT2 to the gate driver 400 and the data driver 500, respectively.

The gate control signals CONT1 include a vertical synchronizing start signal STV for indicating the beginning of a frame, a gate clock signal CPV for controlling the output time of the gate-on voltage $V_{on}$, and an output enable signal OE for defining the duration of the gate-on voltage $V_{on}$.

The data control signals CONT2 include a horizontal synchronizing start signal STH for indicating the beginning of data transmission, a load signal LOAD for instructing to apply the data voltages to the data lines $D_1$-$D_m$, a reverse signal RVS for reversing the polarity of the data voltages with respect to the common voltage $V_{com}$, and a data clock signal HCLK.

Responsive to the data control signals CONT2 from the signal controller 600, the data driver 500 successively receives the image data DAT for a row of the pixels from the signal controller 600, shifts them, converts the image data DAT into analog data voltages selected from the gray voltages from the gray voltage generator 800, and then applies the data voltages to data lines $D_1$-$D_m$.

The gate driver 400 applies the gate-on voltage Von to the gate lines $G_1$-$G_n$ in response to the gate control signals CONT1 from the signal controller 600, and thereby turns on the switching elements Q connected thereto. The data voltages applied to the data lines $D_1$-$D_m$ are applied to the corresponding pixel through the activated switching elements Q.

The difference between the data voltage applied to the pixel and the common voltage $V_{com}$ is represented as a voltage across the LC capacitor $C_{LC}$, namely, a pixel voltage. The LC molecules in the LC capacitor $C_{LC}$ have orientations depending on the magnitude of the pixel voltage.

The light source driver 920 controls current applied to the light source section 910 for switching the LED 344 of the light source section 910, and also controls the brightness of the light from the LED 344.

When the light emitted from the LED 344 passes through the LC layer 3, the polarization of the light is varied according to the orientations of the LC molecules. The polarizer converts the difference of the light polarization into a difference of the light transmittance.

By repeating this procedure by a unit of the horizontal period (which is denoted by "1 H" and is equal to one period of the horizontal synchronizing signal $H_{sync}$, the data enable signal DE, and the gate clock CPV), all gate lines $G_1$-$G_n$ are sequentially supplied with the gate-on voltage $V_{on}$ during a frame, thereby applying the data voltages to all pixels. When the next frame starts after finishing one frame, the reverse control signal RVS applied to the data driver 500 is controlled such that the polarity of the data voltages is reversed with respect to that of the previous frame (which is referred to as "frame inversion"). The reverse control signal RVS may be also controlled such that the polarity of the data voltages flowing in a data line in one frame are reversed (for example, line inversion and dot inversion), or the polarity of the data voltages in one packet are reversed (for example, column inversion and dot inversion).

Hereinafter, an LED for a backlight device according to an embodiment of the present invention will be described with reference to FIG. 4, FIG. 5, and FIG. 6.

Figure 4:
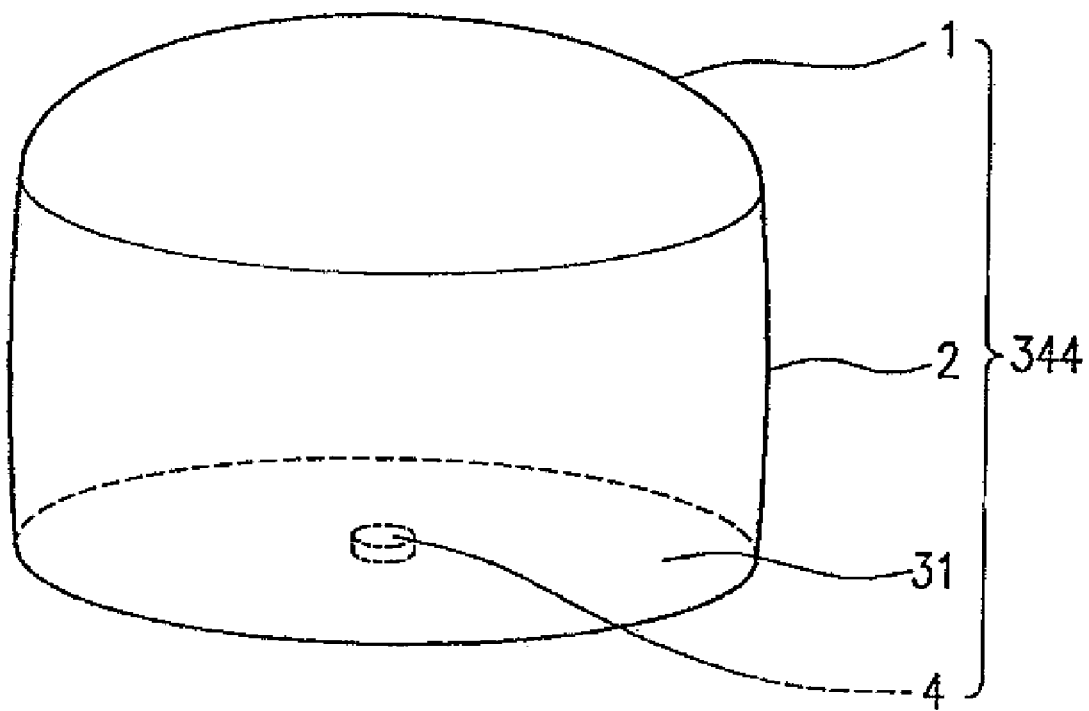
FIG. 4 is a perspective view of a light emitting diode according to an embodiment of the present invention.

FIG. 4 is a perspective view of an LED according to an embodiment of the present invention. FIG. 5 is a cross-sectional view of the LED of FIG. 4. FIG. 6 is a reference view for illustrating the refraction of light at the surface of a lens of the LED of FIG. 4.

Figure 5:
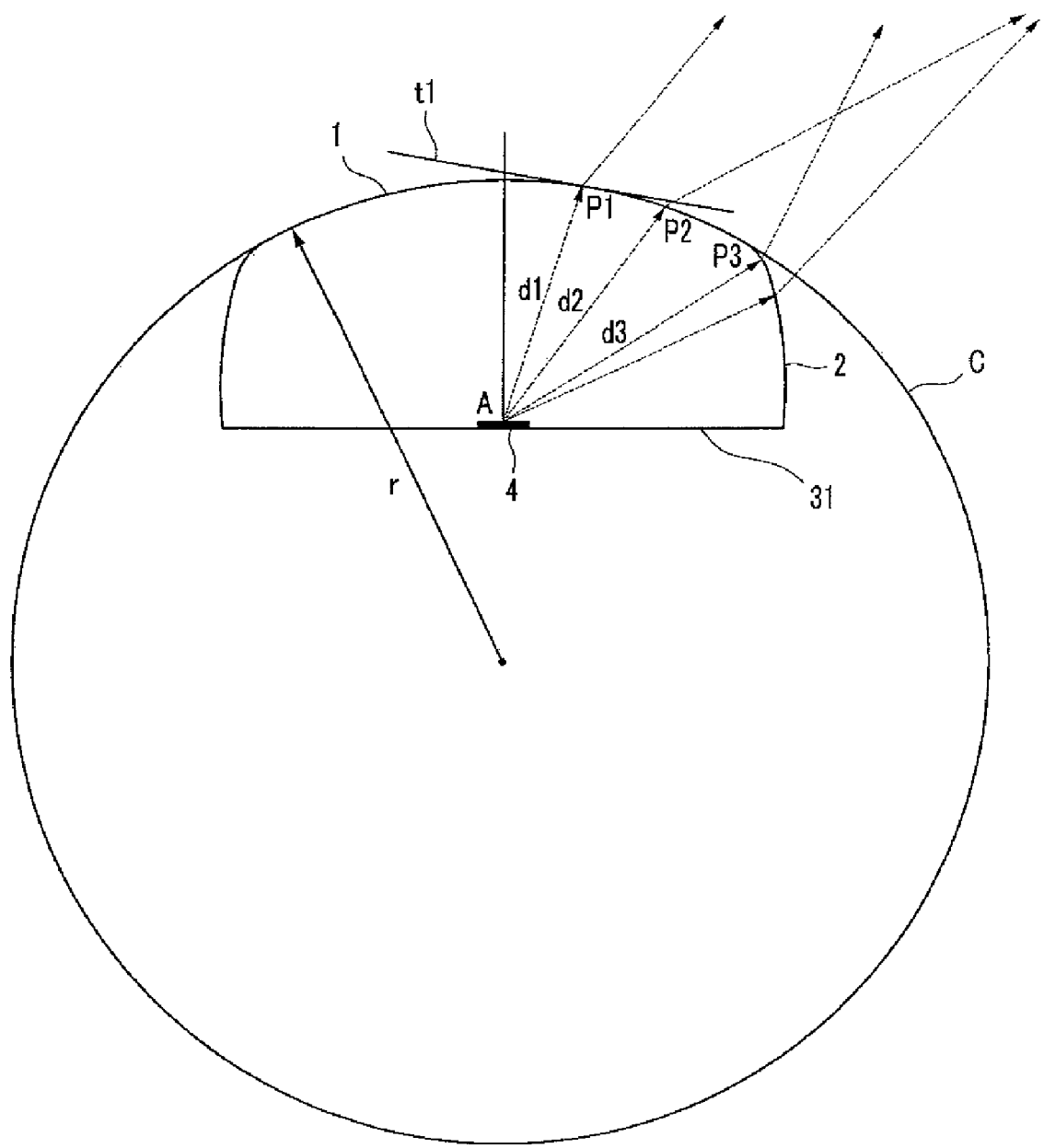
FIG. 5 is a cross-sectional view of the light emitting diode of FIG. 4.

Referring to FIG. 4 and FIG. 5, an LED 344 comprises a light emitting chip 4 and a lens. The lens is made of a transparent dielectric material and includes a base 31, a curved circumferential surface 2 which extends from the base 31, and a curved central surface 1 which extends from the curved circumferential surface 2. The base 31 has a groove for receiving the light emitting chip 4 therein.

It is preferable that the curved central surface 1 of the lens has a convex shape when viewed from the light emitting chip 4, and is symmetrical with respect to a lens axis which vertically extends from the center of the light emitting chip 4. In the lens shown in FIGS. 4 and 5, a distance, for example $d_1$, $d_2$ or $d_3$ from a point A of the light ray emitting surface of the light emitting chip 4 to a point, for example $P_1$, $P_2$, $P_3$ of the curved central surface 1 is always shorter than the radius of curvature r (of osculating circle C) for the corresponding point of the curved central surface 1. The osculating circle C at, for example, point $P_1$ has the same tangent $t_1$ as the curved central surface 1 at point $P_1$. This condition is hereinafter referred to as "the first condition of the radius of curvature" and results in uniform dispersion of the light ray emitted from the light emitting chip 4 to a wider area.

While only considering the lens, it is preferable that a distance from the center of the base 31 to a point of the curved central surface 1 is always shorter than the radius of curvature for the corresponding point of the curved central surface 1. This condition is hereinafter referred to as "the modified first condition of the radius of curvature". Otherwise, referring to FIG. 6, it is preferable to construct a lens so that an acute angle B1 formed between a line linking the center of the base 31 to a point P of the curved central surface 1 and the main axis of the lens ("Lens axis" in FIG. 6) is always larger than an acute angle B2 formed between a normal for the corresponding point of the curved central surface 1 and the main axis of the lens. This condition is hereinafter referred to as "the first condition of light dispersion".

The shape of the curved circumferential surface 2 results by steeply cutting the side of the lens, so that the size of the lens is reduced and incident light which excessively slants toward the side of the lens is redirected to the upper direction of the lens. However, if necessary, the lens may be constructed so that the curved circumferential surface 2 satisfies the first condition of the radius of curvature or the first condition of light dispersion. That is, the lens may be constructed in such a way that the curved central surface 1 extends to the base 31, omitting the curved circumferential surface 2.

The radius of curvature is more abruptly changed at the boundary area of the curved central surface 1 and the curved circumferential surface 2 as compared with at the curved central surface 1 or at the curved circumferential surface 2, and therefore it may be discontinuous. A discontinuous radius of curvature brings a discontinuous light distribution. Therefore, it is preferable to trim the boundary corner for a continuous variation of the radius of curvature. It is also preferable that the position of the boundary of the curved central surface 1 and the curved circumferential surface 2 is controlled depending on the light emitting distribution. For example, the boundary of the curved central surface 1 and the curved circumferential surface 2 is placed at an angle between about 20 degrees and about 50 degrees from the center of the groove for receiving the light emitting chip 4. That is, since the light ray emitted from the light emitting chip 4 is condensed within an angle between about 20 degrees and about 50 degrees from the center of the groove and is rarely distributed beyond that range, it is enough that the lens is formed in order that the curved central surface 1 covers the light condensed region.

In a lens satisfying the first condition of the radius of curvature or the first condition of light dispersion, the light ray emitted from the light emitting chip 4 is always refracted in a receding direction from the main axis of the lens. This will be described with reference to FIG. 6.

Figure 6:
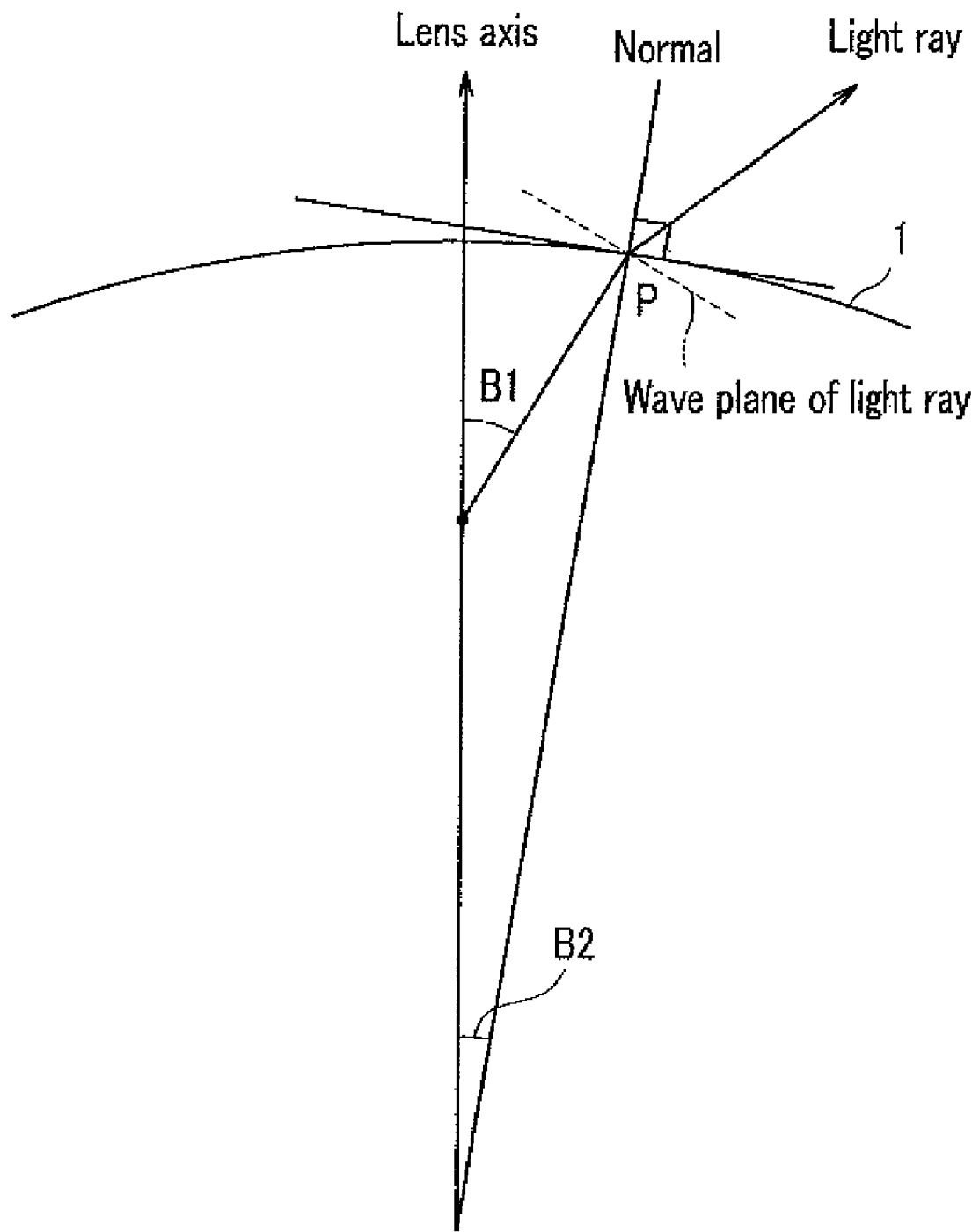
FIG. 6 is a reference view for illustrating the refraction of light at the surface of a lens of the light emitting diode of FIG. 4.

If the lens satisfies the first condition of the radius of curvature or the first condition of light dispersion, when the wave plane of the light meets the curved central surface 1 as shown in FIG. 6, the wave plane near the main axis of the lens first enters into the air before passing through the lens. As a result, the incident light is refracted in the receding direction from the main axis of the lens due to the difference of the speed of the light in air and in the lens.

Figure 7:
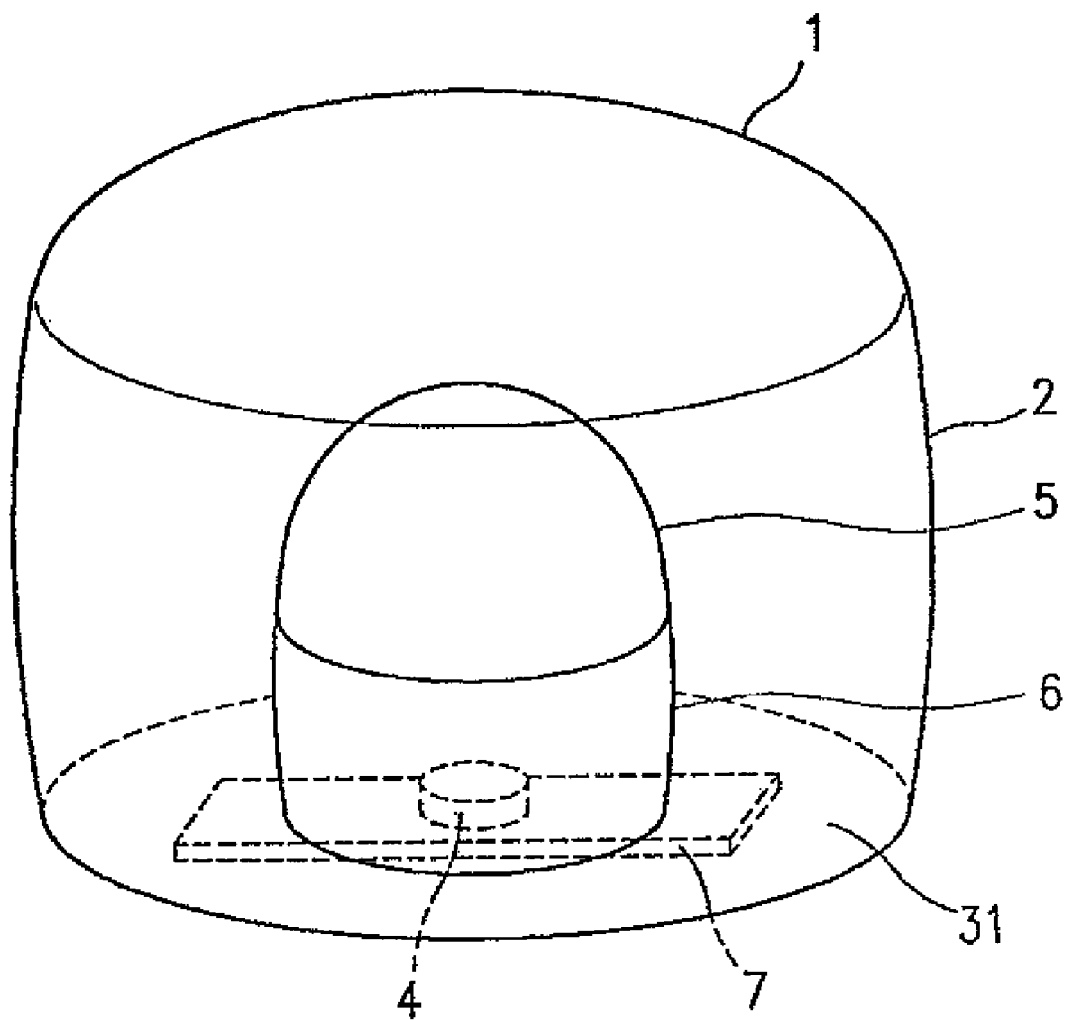
FIG. 7 is a perspective view of a light emitting diode according to an embodiment of the present invention.
Figure 8:
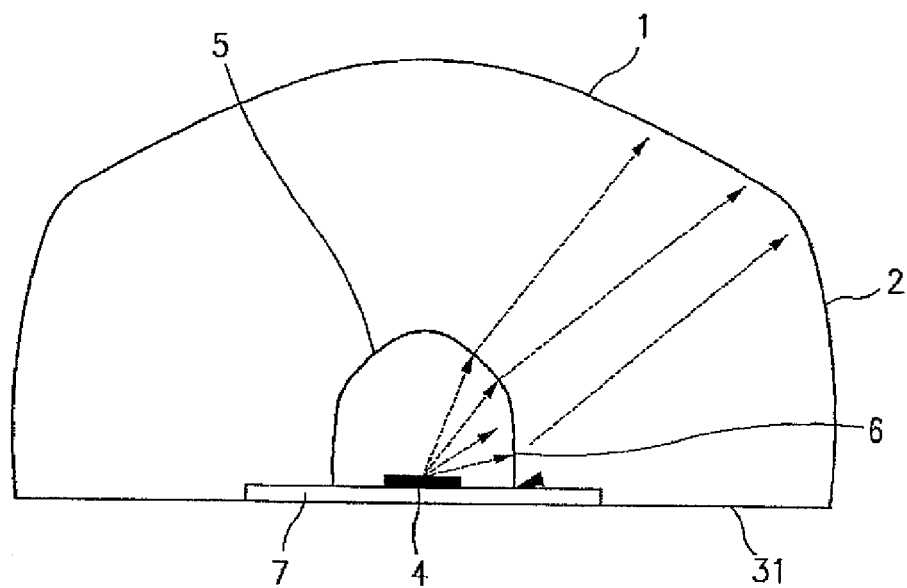
FIG. 8 is a cross-sectional view of the light emitting diode of FIG. 7.

FIG. 7 is a perspective view of an LED according to an embodiment of the present invention, and FIG. 8 is a cross-sectional view of the LED of FIG. 7.

As compared to that of the embodiment described in connection with FIGS. 4-6, this LED further comprises a central hollow portion upwardly formed from a base 31, and a supporting unit 7 provided on the base 31 for supporting a light emitting chip 4 thereon.

The central hollow portion comprises a curved central surface 5 and a curved circumferential surface 6 which are the inner surface of the lens. It is preferable that the curved central surface 5 of the central hollow portion has a convex shape when viewed from the light emitting chip 4 and is symmetrical with respect to the main axis of the lens, which vertically extends from the center of the light emitting chip 4. In this lens, a distance from a point of the light emitting surface of the light emitting chip 4 to a point of the curved central surface 5 is always longer than the radius of curvature for the corresponding point of the curved central surface 5. This condition is hereinafter referred to as "the second condition of the radius of curvature" and results in uniform dispersion of the light ray emitted from the light emitting chip 4 to a wider region.

While only considering the lens, it is preferable that a distance from the center of the base 31 to a point of the curved central surface 5 of the central hollow portion is always longer than the radius of curvature for the corresponding point of the curved central surface 5 of the central hollow portion. This condition is hereinafter referred to as "the modified second condition of the radius of curvature". Otherwise, it is preferable to construct the lens so that an acute angle formed between a straight line linking the center of the base 31 to a point of the curved central surface 5 of the central hollow portion and the main axis of the lens is always smaller than an acute angle formed between the normal for the corresponding point of the curved central surface 5 of the central hollow portion and the main axis of the lens. This condition is hereinafter referred to as "the second condition of light dispersion".

The supporting unit 7 is attached to the base 31 for receiving the light emitting chip 4 therein. It is preferable that the supporting unit 7 is attached to the base 31 so as to not close the bottom opening of the central hollow portion. If the bottom opening were closed, the air in the central hollow portion would expand by the heat generated when the light emitting chip 4 is operating, causing the supporting unit 7 to be separated from the lens.

When the curved central surface 5 of the central hollow portion is formed to satisfy the second condition of the radius of curvature or the second condition of light dispersion, the light ray emitted from the light emitting chip 4 is always refracted in the receding direction from the main axis of the lens.

In accordance with the above, since the light ray emitted from the light emitting chip 4 enters the lens passing through the air of the central hollow portion, the curved central surface 5 of the central hollow portion should satisfy the condition of the radius of curvature or the condition of light dispersion opposite to those for the curved central surface 1 of the lens for satisfactory light dispersion.

Figure 9:
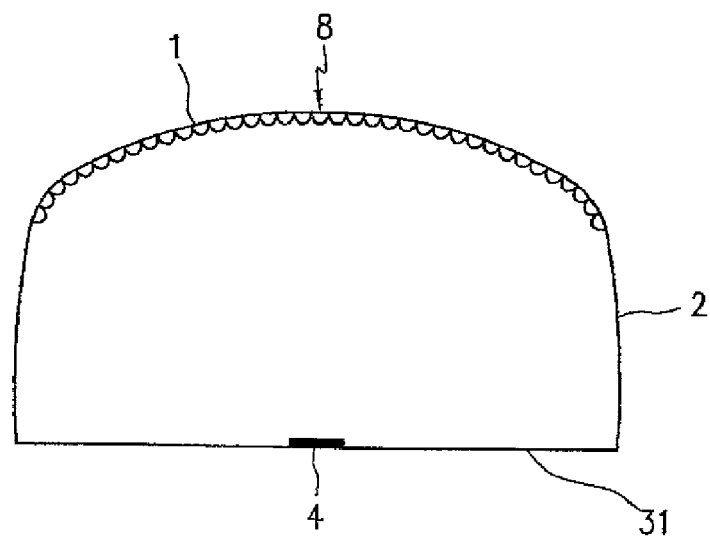
FIG. 9 is a cross-sectional view of a light emitting diode according to an embodiment of the present invention.

FIG. 9 is a cross-sectional view of an LED according to an embodiment of the present invention.

As compared to the embodiment shown in FIG. 4 and FIG. 5, this LED further comprises an uneven pattern 8, which is formed at the curved central surface 1 and the partial curved circumferential surface 2 of the lens. The uneven pattern 8 can be configured as a minute pattern. The uneven pattern 8 causes the light ray to disperse more uniformly. It can be formed at the entire curved central surface 1 and the entire curved circumferential surface 2, or only at the boundary of the curved central surface 1 and the curved circumferential surface 2.

Figure 10:
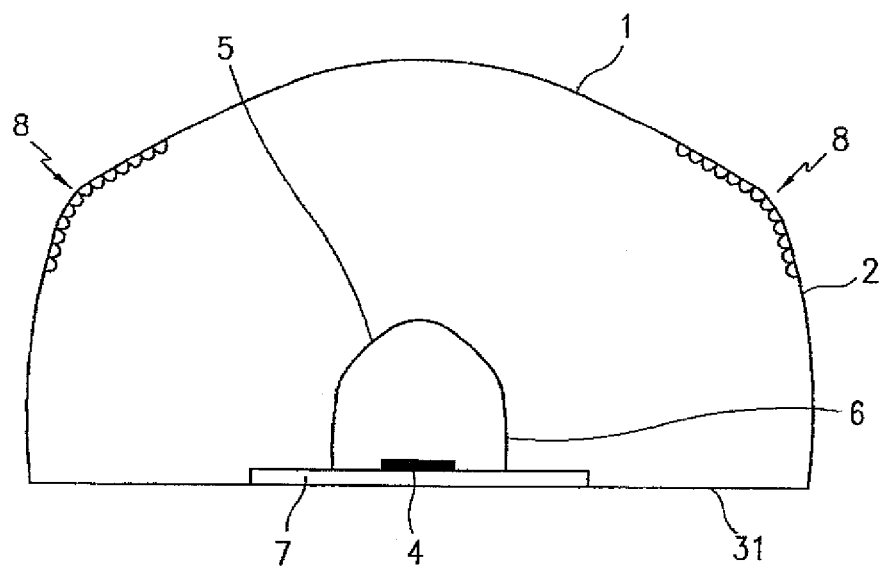
FIG. 10 is a cross-sectional view of a light emitting diode according to an embodiment of the present invention.

FIG. 10 is a cross-sectional view of an LED according to an embodiment of the present invention.

As compared to that of the embodiment shown in FIG. 7 and FIG. 8, this LED further comprises an uneven pattern 8 which is formed at the boundary of the curved central surface 1 and the curved circumferential surface 2. The uneven pattern 8 causes the light ray to disperse more uniformly. It can be formed at the entire curved central surface 1 and the entire curved circumferential surface 2, or only at specific areas of the curved central surface 1 and the curved circumferential surface 2.

In the embodiments shown in FIG. 9 and FIG. 10, although the uneven pattern 8 is provided at the curved central surface 1 and the curved circumferential surface 2, an outline surface resulting by linking top points of the prominences of the uneven pattern 8 satisfies the first condition of the radius of curvature or the modified first condition of the radius of curvature or the first condition of light dispersion.

Figure 11:
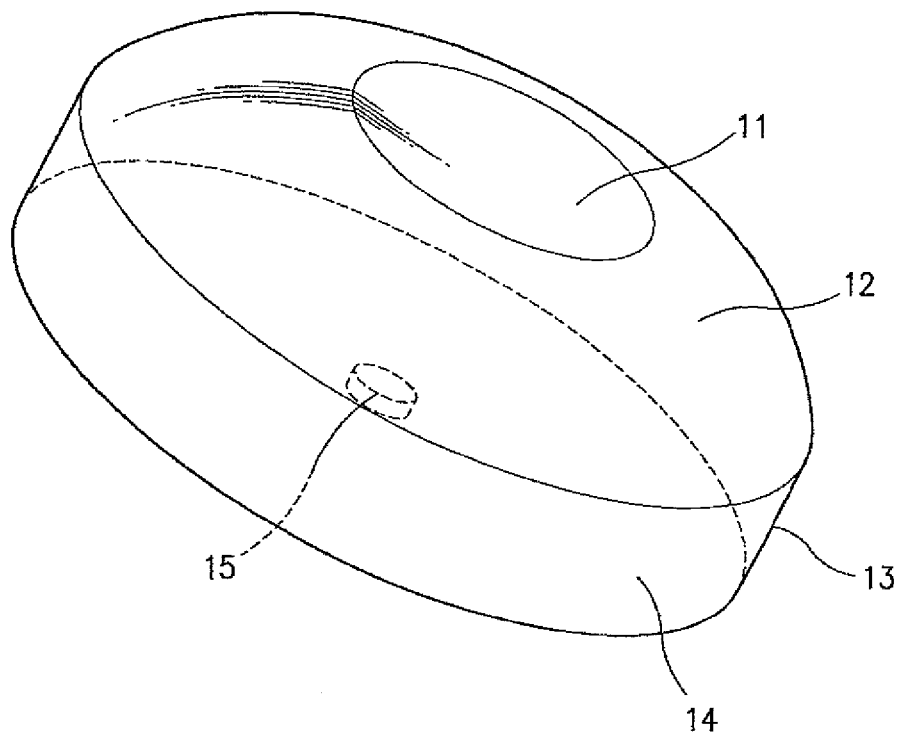
FIG. 11 is a perspective view of a light emitting diode according to an embodiment of the present invention.
Figure 12:
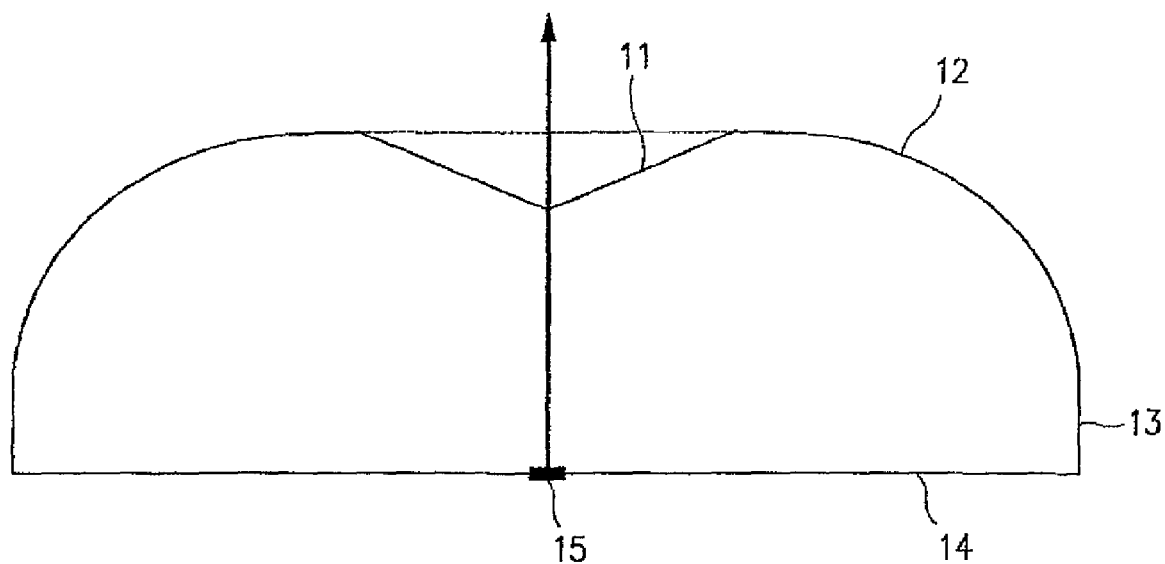
FIG. 12 is a cross-sectional view of the light emitting diode of FIG. 11.
Figure 13:
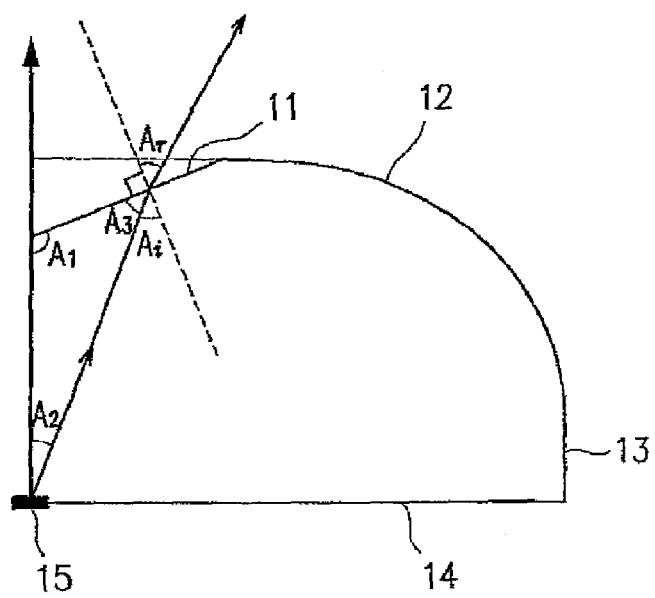
FIG. 13 is a reference view for illustrating the refraction of light at the surface of a lens of the light emitting diode of FIG. 11.

FIG. 11 is a perspective view of an LED according to an embodiment of the present invention, FIG. 12 is a cross-sectional view of the LED of FIG. 11, and FIG. 13 is a reference view for illustrating the light reflection at the surface of the lens for the LED of FIG. 11.

Referring to FIG. 11 and FIG. 12, an LED comprises a light emitting chip 15 and a lens. The lens is formed with a transparent dielectric and includes a base 14, a curved circumferential surface 13 which extends from the base 14, a curved center-edge surface 12 which extends from the curved circumferential surface 13, and a curved centermost surface 11 which extends from the curved center-edge surface 12. The base 14 has a groove for receiving a light emitting chip 15.

It is preferable that the curved center-edge surface 12 of the lens has a convex shape when viewed from the light emitting chip 15, and is symmetrical with respect to the main axis of the lens which vertically extends from the center of the light emitting chip 15. In this lens, a distance from a point of the light emitting surface of the light emitting chip 15 to a point of the curved center-edge surface 12 is always shorter than the radius of curvature for the corresponding point of the curved center-edge surface 12 of the lens (i.e., the first condition of the radius of curvature). This is to uniformly disperse the light ray emitted from the light emitting chip 15 to a wider region.

While only considering the lens, it is preferable that a distance from the center of the base 14 to a point of the curved center-edge surface 12 of the lens is always shorter than the radius of curvature for the corresponding point of the curved center-edge surface 12 (i.e., the modified first condition of the radius of curvature). Otherwise, it is preferable to construct the lens so that an acute angle formed between a straight line linking the center of the base 14 to a point of the curved center-edge surface 12 of the central hollow and the main axis of the lens is always larger than an acute angle formed between the normal for the corresponding point of the curved center-edge surface 12 and the main axis of the lens (i.e., the first condition of light dispersion).

It is preferable that the curved centermost surface 11 of the lens has a concave shape when viewed from the light emitting chip 15 and is symmetrical with respect to the main axis of the lens which vertically extends from the center of the light emitting chip 15. Also, the curved centermost surface 11 is formed to satisfy the following equation:

$$A1+A2<90+\sin^{-1}(1/n) \quad \text{(Equation 1)}$$

where n is a refraction index, A1 is an obtuse angle formed between the main axis of the lens and a tangent line of a point on the curved centermost surface 11, and A2 is an acute angle formed between a line linking the center of the light emitting chip 15 to the corresponding point of the curved centermost surface 11 and the main axis of the lens.

When the curved centermost surface 11 satisfies the above equation, the light ray emitted from the light emitting chip 15 is refracted at the curved centermost surface 11 and then is dispersed without total internal reflection. In other words, most of the light ray from the light emitting chip 15 is upwardly dispersed passing through the curved centermost surface 11 and the curved center-edge surface 12.

In this manner, since most of the light ray is directly dispersed upward without the reflection, the light ray from the light emitting diode can be efficiently used.

Hereinafter, the derivation of Equation 1 will be described with reference to FIG. 13.

In FIG. 13, Ai is the angle of incidence measured when the light ray emitted from the light emitting chip 15 is directed toward a point of the curved centermost surface 11, Ar is the angle of refraction, and n is the index of refraction. With these elements, Snell's Law is expressed by the following equation:

$$\text{Sin } Ar/\text{Sin } Ai=n/1 \quad \text{(Equation 2)}$$

If a total internal reflection occurs, Ar is 90 degrees. Accordingly, the critical angle of incidence Ai is derived by the following equations:

$$\text{Sin } Ai=1/n \quad \text{(Equation 3)}$$

$$Ai=\text{Sin}^{-1}(1/n) \quad \text{(Equation 4)}$$

Therefore, the condition that the total internal reflection does not occur is expressed by the following equation:

$$Ai<\text{Sin}^{-1}(1/n) \quad \text{(Equation 5)}$$

In FIG. 13, since the sum of the internal angles of a triangle is 180 degrees, the following equation is given:

$$A1+A2+A3=180 \text{ degrees} \quad \text{(Equation 6)}$$

In FIG. 13, the following equation is also given:

$$Ai+A3=90 \text{ degrees} \quad \text{(Equation 7)}$$

From the equations 5, 6, and 7, Equation 1 is derived. That is, Equation 1 means the condition that the total reflection of the light from the light emitting chip 15 does not occur at the curved centermost surface 11.

The shape of the circumferential curved surface 13 results from steeply cutting the side of the lens, so that the size of the lens is reduced and the incident light which excessively slants toward the side of the lens is redirected to the upper direction of the lens. If necessary, the lens may be constructed so that a distance from a point of the light emitting surface of the light emitting chip 15 to a point of the curved circumferential surface 13 is always shorter than the radius of curvature for the corresponding point of the curved circumferential surface 13 of the lens. That is, the lens may be constructed in such a way that the curved center-edge surface 12 extends until it reaches to the base 14, omitting the formation of the curved circumferential surface 13.

The radius of curvature is more abruptly changed at the boundary of the curved centermost surface 11 and the curved center-edge surface 12 and at the boundary of the curved center-edge surface 12 and the curved circumferential surface 13 as compared to at the curved centermost surface 11, the curved center-edge surface 12, or the curved circumferential surface 13. The abrupt change in the radius of curvature results in a discontinuous radius of curvature, which causes a discontinuous light distribution. Therefore, it is preferable to trim the boundary corners for a continuous variation of the radius of curvature.

It is also preferable that the position of the boundary of the curved centermost surface 11 and the curved center-edge surface 12 and the position of the boundary of the curved center-edge surface 12 and the curved circumferential surface 13 are controlled depending on the light emitting distribution. For example, the boundary of the curved center-edge surface 12 and the curved circumferential surface 13 is positioned at an angle between about 20 degrees and about 50 degrees with respect to the center of the groove. That is, since the light ray emitted from the light emitting chip 15 is condensed within an angle between about 20 degrees and about 50 degrees to the center of the groove and is rarely distributed beyond that range, it is enough that the lens is formed in order that the curved centermost surface 11 and the curved center-edge surface 12 cover the light condensed region.

When the first curved centermost surface 11 satisfies Equation 1 and the curved center-edge surface 12 satisfies the first condition of the radius of curvature, the light ray emitted from the light emitting chip 15 is always refracted at the curved centermost surface 11 and the curved center-edge surface 12 in the receding direction from the main axis of the lens.

Figure 14:
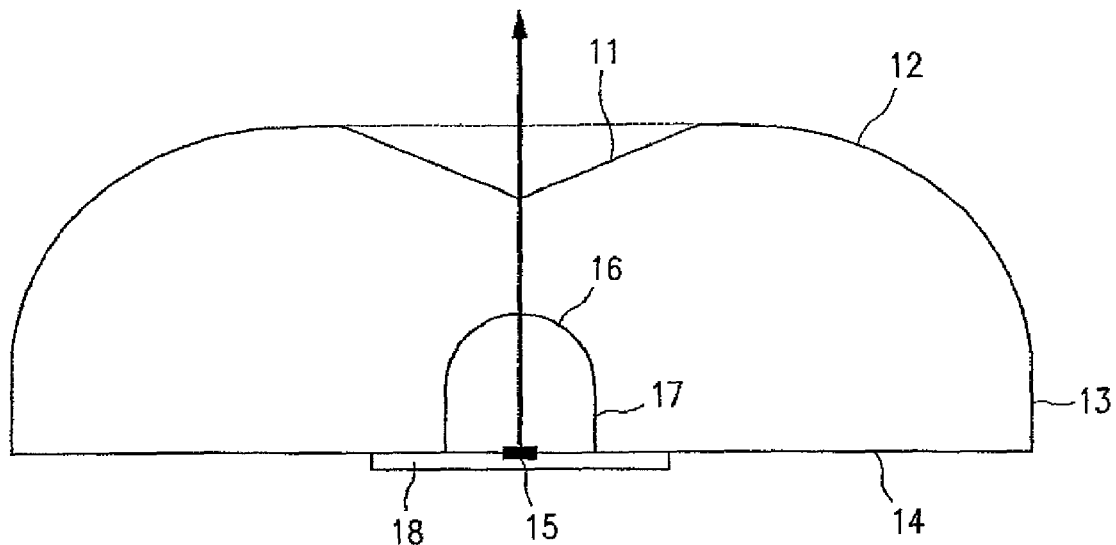
FIG. 14 through FIG. 18 are cross-sectional views of light emitting diodes according to embodiments of the present invention.

FIG. 14 is a cross-sectional view of a light emitting diode according to an embodiment of the present invention.

As compared to that of the embodiment shown in FIG. 11 and FIG. 12, this light emitting diode further comprises a central hollow portion upwardly formed from a base 14, and a supporting unit 7 is attached to the base 14 for supporting a light emitting chip 15 thereon.

The central hollow portion comprises a curved circumferential surface 17 and a curved central surface 16, which form an inner surface of the lens. It is preferable that the curved central surface 16 of the central hollow portion has a convex shape when viewed from the light emitting chip 15, and is symmetrical with respect to the main axis of the lens which vertically extends from the center of the light emitting chip 15. In this lens, a distance from a point of the light emitting surface of the light emitting chip 15 to a point of the curved central surface 16 of the central hollow portion is always longer than the radius of curvature for the corresponding point of the curved central surface 16 (i.e., the second condition of the radius of curvature). This is to uniformly disperse the light ray emitted from the light emitting chip 15 to a wider region.

While only considering the lens, it is preferable that a distance from the center of the base 14 to a point of the curved central surface 16 of the central hollow portion is always longer than the radius of curvature for the corresponding point of the curved central surface 16 (i.e., the modified second condition of the radius of curvature). Otherwise, it is preferable to construct the lens so that an acute angle formed between a straight line linking the center of the base 14 to a point of the curved central surface 16 of the central hollow portion and the main axis of the lens is always smaller than an acute angle formed between the normal for the corresponding point of the curved central surface 16 and the main axis of the lens (i.e., the second condition of light dispersion).

A supporting unit 18 is attached to the base 14 for receiving the light emitting chip 15 therein. Here, it is preferable that the supporting unit 18 is attached to the base 14 not so as to close a bottom opening of the central hollow portion. If the opening were closed, the air in the central hollow portion would expand by the heat generated when the light emitting chip 15 is operating, causing the supporting unit 18 to separate from the lens.

If the central hollow portion is formed to satisfy the above-mentioned conditions, the light ray emitted from the light emitting chip 15 is always refracted at the curved central surface 16 of the central hollow portion in the receding direction from the main axis of the lens.

Figure 15:
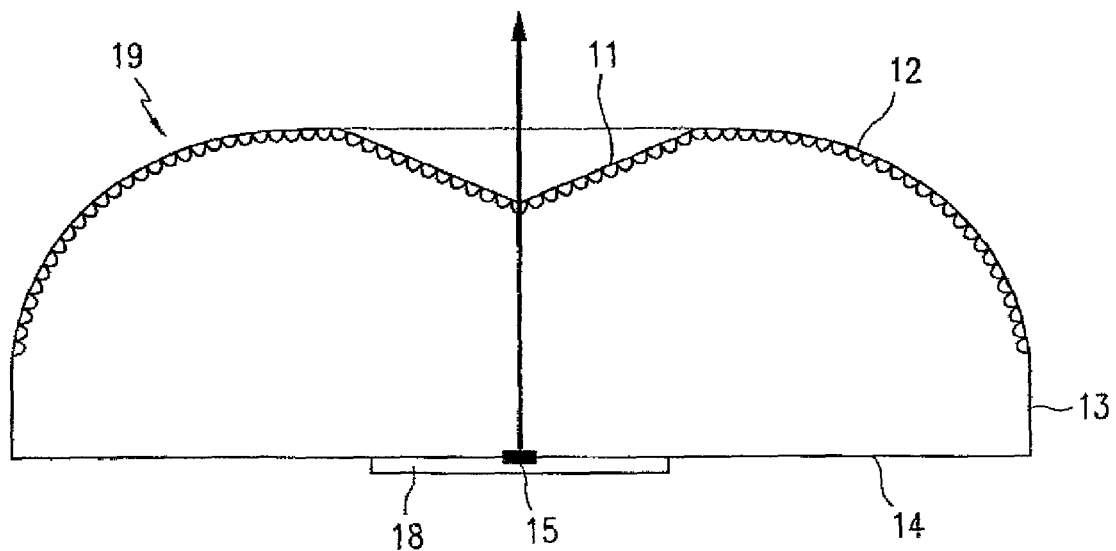

FIG. 15 is a cross-sectional view of an LED according to an embodiment of the present invention.

As compared to that of the embodiment shown in FIG. 11 and FIG. 12, this LED further comprises an uneven pattern 19 which is formed at the entire curved centermost surface 11, the entire curved center-edge surface 12, and the partial curved circumferential surface 13 of the lens. The uneven pattern 19 as a minute pattern. The uneven pattern 19 causes more uniform dispersion of the light ray and can be formed at the entire curved centermost surface 11, the entire curved center-edge surface 12, and the entire curved circumferential surface 13, or only at the boundary of the second central curved surface 12 and the curved circumferential surface 13.

Figure 16:
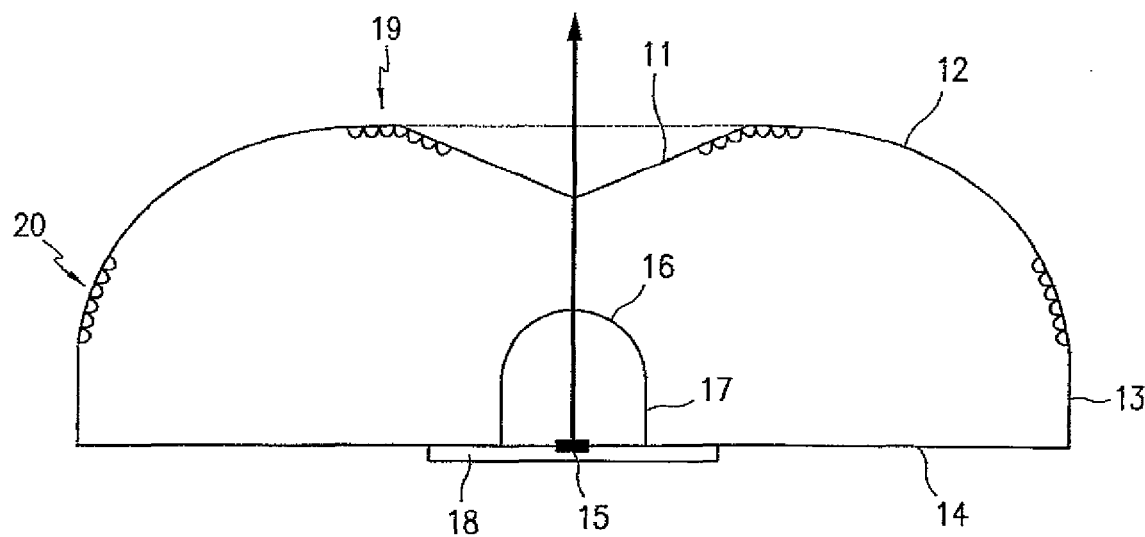

FIG. 16 is a cross-sectional view of an LED according to an embodiment of the present invention.

As compared to that of the embodiment shown in FIG. 14, this LED further comprises uneven patterns 19 and 20 which are individually formed at the boundary of the curved centermost surface 11 and the curved center-edge surface 12 and at the boundary of the curved center-edge surface 12 and the circumferential curved surface 13. The uneven patterns 19 and 20 cause more uniform dispersion of the light ray and can be configured as minute patterns. The uneven patterns 19 and 20 can be formed entirely over the first central curved surface 11, the second central curved surface 12, and the circumferential curved surface 13, or only at the specific areas of the first central curved surface 11, the second central curved surface 12, and the circumferential curved surface 13.

In the embodiments shown in FIG. 15 and FIG. 16, although the uneven patterns 19 and 20 are provided at the curved centermost surface 11, the curved center-edge surface 12, and the curved circumferential surface 13, an outline surface of the curved center-edge surface 12 (created by linking top points of the prominences of the uneven patterns) satisfies the first condition of the radius of curvature or the modified first condition of the radius of curvature or the first condition of light dispersion, and an outline surface of the curved centermost surface 11 satisfies Equation 1.

Figure 17:
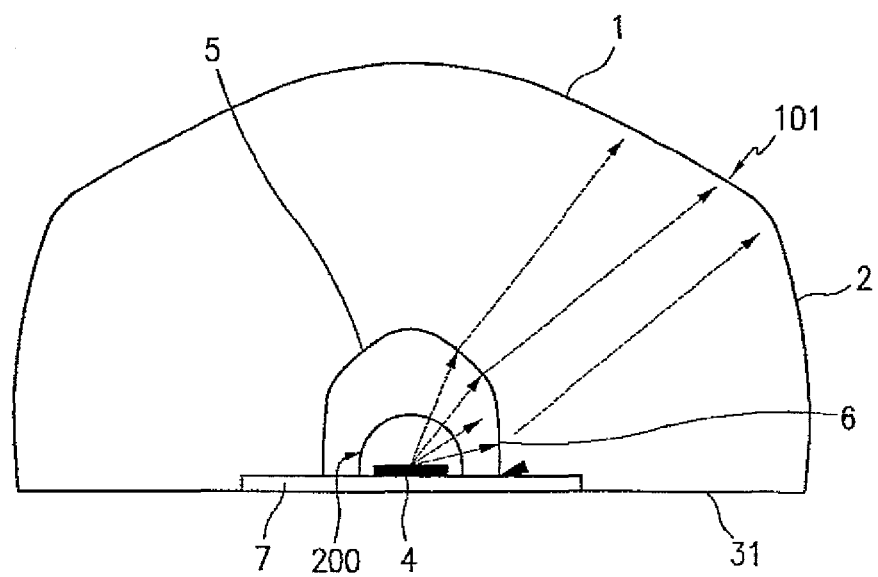

FIG. 17 is a cross-sectional view of an LED according to an embodiment of the present invention.

As compared to that of the embodiment shown in FIG. 7 and FIG. 8, this LED further comprises an inner lens 200 which covers a light emitting chip 4 in a central hollow portion. The inner lens 200 has the same shape as the lens of light emitting diode shown in FIG. 4 and FIG. 5. That is, the inner lens 200 comprises a base, a curved circumferential surface that extends from the base, a curved central surface which extends from the curved circumferential surface, and a groove which is provided in the base for receiving the light emitting chip 4 therein. The curved central surface of the inner lens 200 satisfies the first condition of the radius of curvature or the first condition of light dispersion. Also, the inner lens 200 may be formed in such a way that the curved central surface extends to the base, omitting the curved circumferential surface.

In the LED shown in FIG. 17, since the refraction is generated at the outer surface of the inner lens, the inner surface of outer lens, and the outer surface of the outer lens, the light ray is dispersed to a wider region.

Figure 18:
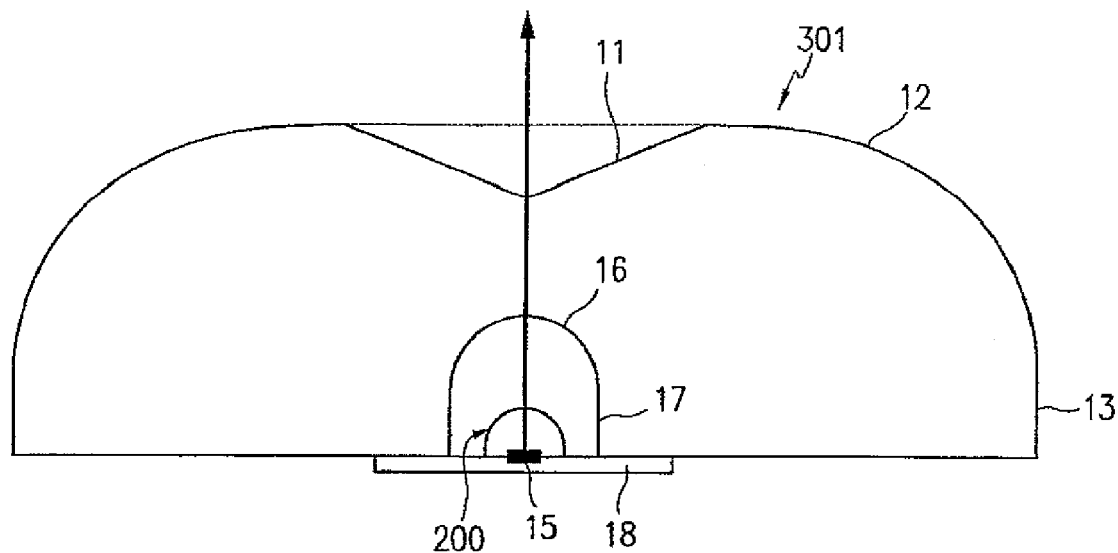

FIG. 18 is a cross-sectional view of an LED according to an embodiment of the present invention.

As compared to that of the embodiment shown in FIG. 14, this LED further comprises an inner lens 200 which covers a light emitting chip 15 in a central hollow portion. The inner lens 200 has the same shape as the lens of light emitting diode shown in FIG. 4 and FIG. 5. That is, the inner lens 200 comprises a base, a curved circumferential surface that extends from the base, a curved central surface which extends from the curved circumferential surface, and a groove which is provided in the base of the inner lens 200 for receiving the light emitting chip 15 therein. The curved central surface of the inner lens 200 satisfies the first condition of the radius of curvature or the first condition of light dispersion. Also, the inner lens 200 may be formed in such a way that the curved central surface extends to the base, omitting the curved circumferential surface.

In the LED shown in FIG. 18, since the refraction is generated at the outer surface of the inner lens, the inner surface of the outer lens, and the outer surface of the outer lens, the light ray is dispersed to a wider region.

In the embodiments shown in FIG. 17 and FIG. 18, the inner lens has the same shape as the lens of the light emitting diode shown in FIG. 4 and FIG. 5, but the shape of the inner lens can be varied. Hereinafter, such variations will be described.

Figure 19:
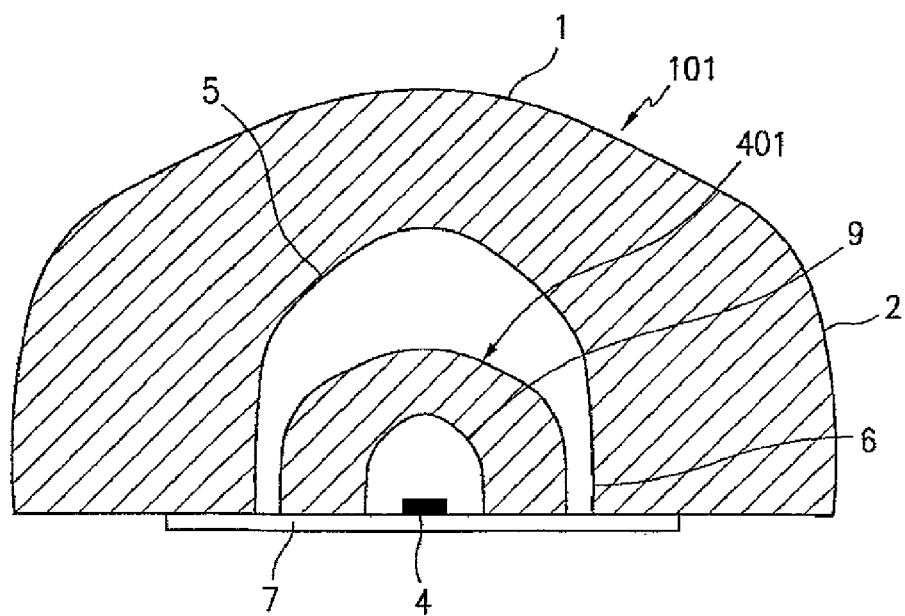
FIG. 19 through FIG. 24 are cross-sectional views showing LEDs according to embodiments of the present invention.

Referring to FIG. 19, an LED includes an outer lens 101 and an inner lens 401. The outer lens 101 has the same shape as the lens of the LED of FIG. 7 and FIG. 8. The inner lens 401 is provided in the central hollow portion of the outer lens 101 and has a central hollow portion 9 therein. A light emitting chip 4 is provided in the central hollow portion 9 of the inner lens 401. The inner lens 401 has the same shape as the lens of the LED shown in FIG. 7 and FIG. 8. That is, the inner lens 401 comprises an outer surface, an inner surface defining the central hollow portion 9, and a base. The outer surface of the inner lens 401 comprises a curved circumferential surface and a curved central surface which satisfies the first condition of the radius of curvature or the first condition of light dispersion, and the inner surface comprises a curved circumferential surface and a curved central surface which satisfies the second condition of the radius of curvature or the second condition of light dispersion.

In the LED shown in FIG. 19, since the refraction is generated at the inner and outer surfaces of the inner lens, and at the inner and outer surfaces of the outer lens, the light ray is dispersed to a wider region.

Figure 20:
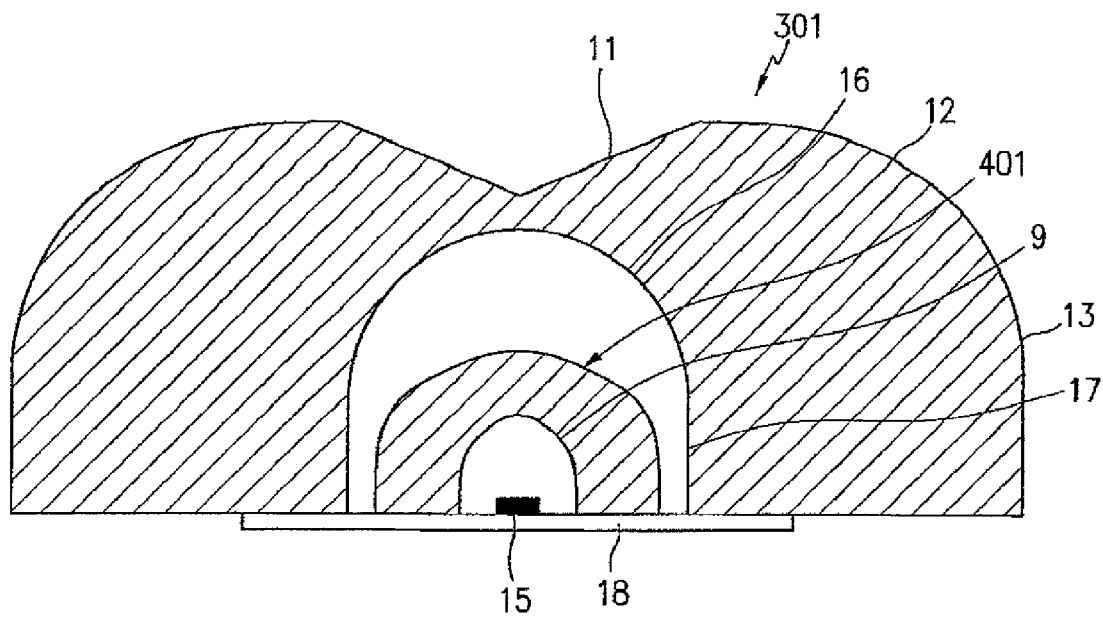

Referring to FIG. 20, an LED includes an outer lens 301 and an inner lens 401. The outer lens 301 has the same shape as the lens of the LED of FIG. 14. The inner lens 401 is provided in the central hollow portion of the outer lens 301 and has a central hollow portion 9 therein. A light emitting chip 15 is provided in the central hollow portion 9 of the inner lens 401. The inner lens 401 has the same shape as the lens of the LED shown in FIG. 7 and FIG. 8. That is, the inner lens 401 comprises an outer surface, an inner surface defining the central hollow portion 9, and a base. The outer surface of the inner lens 401 comprises a curved circumferential surface and a curved central surface that satisfies the first condition of the radius of curvature or the first condition of light dispersion. The inner surface of the inner lens 401 comprises a curved circumferential surface and a curved central surface that satisfies the second condition of the radius of curvature or the second condition of light dispersion.

In the LED shown in FIG. 20, since the refraction is generated at the inner and outer surfaces of the inner lens, and at the inner and outer surfaces of outer lens, the light ray is dispersed to a wider region.

Figure 21:
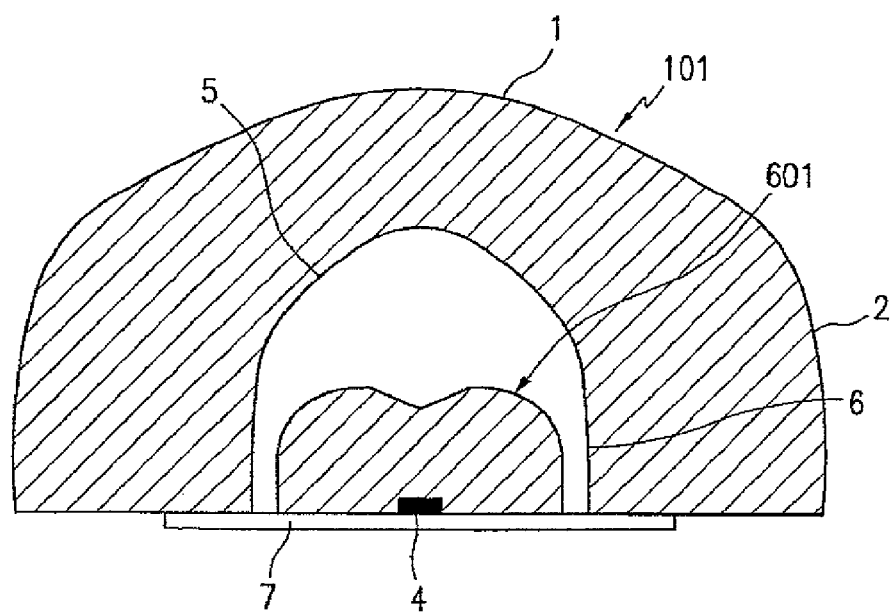

Referring to FIG. 21, an LED includes an outer lens 101 and an inner lens 601. The outer lens 101 has the same shape as the lens of the LED of FIG. 7 and FIG. 8. The inner lens 601 is provided in the central hollow portion of the outer lens 101 and covers a light emitting chip 4. The inner lens 601 has the same shape as the lens of the light emitting diode shown in FIG. 11 and FIG. 12. That is, the inner lens 601 made of a transparent dielectric comprises a base, a curved circumferential surface which extends from the base, a curved center-edge surface which extends from the curved circumferential surface, and a curved centermost surface which extends from the curved center-edge surface. A groove is provided in the base of the inner lens 601 for receiving the light emitting chip 4 therein. The curved center-edge surface of the inner lens 601 satisfies the first condition of the radius of curvature or the first condition of light dispersion, and the curved centermost surface satisfies Equation 1 relating to the condition that no total refraction is generated.

In the LED shown in FIG. 21, since the refraction is generated at the outer surface of the inner lens, and at the inner and outer surfaces of the outer lens, the light ray is dispersed to a wider region.

Figure 22:
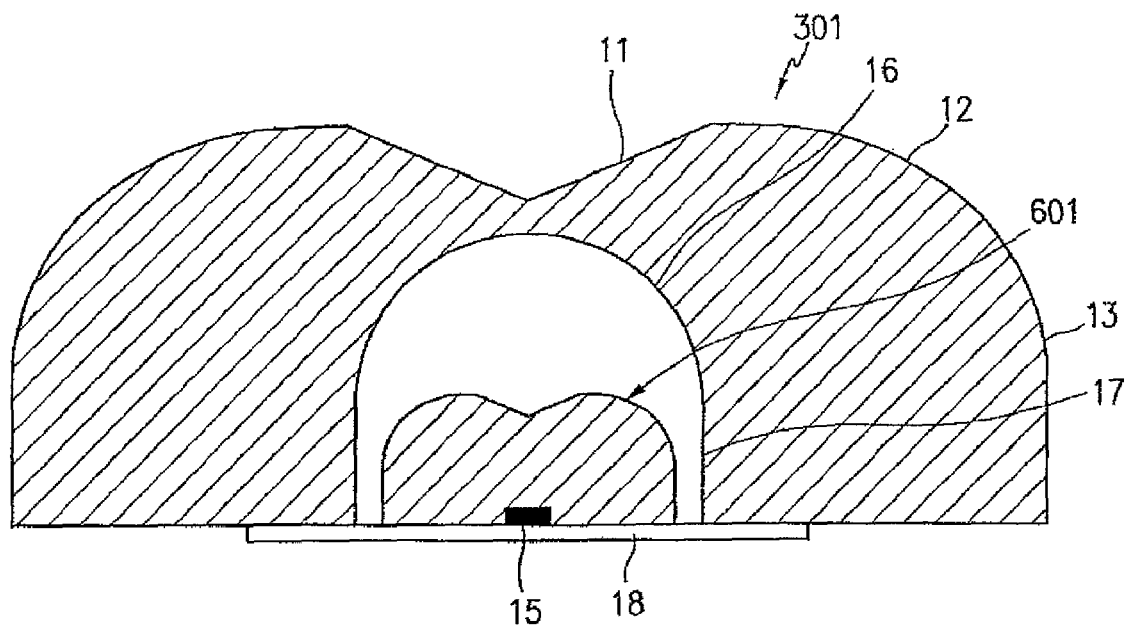

Referring to FIG. 22, an LED includes an outer lens 301 and an inner lens 601. The outer lens 301 has the same shape as the lens of the LED shown in FIG. 14. The inner lens 601 is provided in the central hollow portion of the outer lens 301 and covers a light emitting chip 15. The inner lens 601 has the same shape as the lens of the LED shown in FIG. 11 and FIG. 12. That is, the inner lens 601 made of a transparent dielectric comprises a base, a curved circumferential surface that extends from the base, a curved center-edge surface that extends from the curved circumferential surface, and a curved centermost surface which extends from the curved center-edge surface. A groove is provided in the base of the inner lens 601 for receiving the light emitting chip 15 therein. The curved center-edge surface of the inner lens 601 satisfies the first condition of the radius of curvature or the first condition of light dispersion, and the curved centermost surface satisfies Equation 1 relating to the condition that no total refraction is generated.

In the LED shown in FIG. 22, since the refraction is generated at the outer surface of the inner lens, and at the inner and outer surfaces of outer lens, the light ray is dispersed to a wider region.

Figure 23:
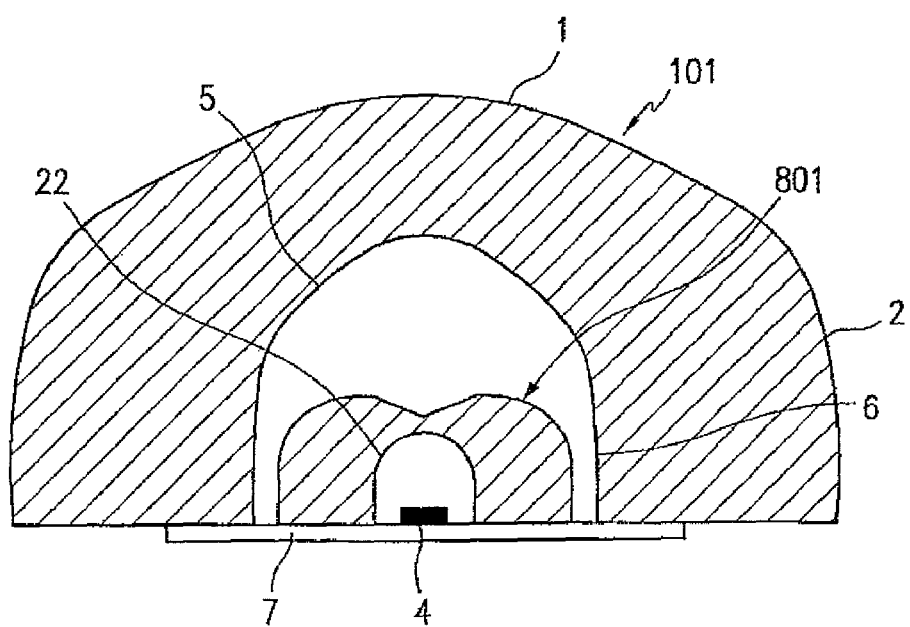

Referring to FIG. 23, an LED includes an outer lens 101 and an inner lens 801. The outer lens 101 has the same shape as the lens of the LED shown in FIG. 7 and FIG. 8. The inner lens 801 is provided in the central hollow portion of the outer lens 101 and has a central hollow portion 22 therein. A light emitting chip 4 is provided in the central hollow portion 22 of the inner lens 801. The inner lens 801 has the same shape as the lens of the LED shown in FIG. 14. That is, the inner lens 801 comprises an outer surface, an inner surface defining the central hollow portion 22, and a base. The outer surface of the inner lens 801 comprises a curved circumferential surface, a curved center-edge surface which satisfies the first condition of the radius of curvature or the first condition of light dispersion, and a curved centermost surface which satisfies Equation 1 relating to the condition that no total refraction is generated, and the inner surface of the inner lens 801 comprises a curved circumferential surface and a curved central surface which satisfies the second condition of the radius of curvature or the second condition of light dispersion.

In the LED shown in FIG. 23, since the refraction is generated at the inner and outer surfaces of the inner lens, and at the inner and outer surfaces of the outer lens, the light ray is dispersed to a wider region.

Figure 24:
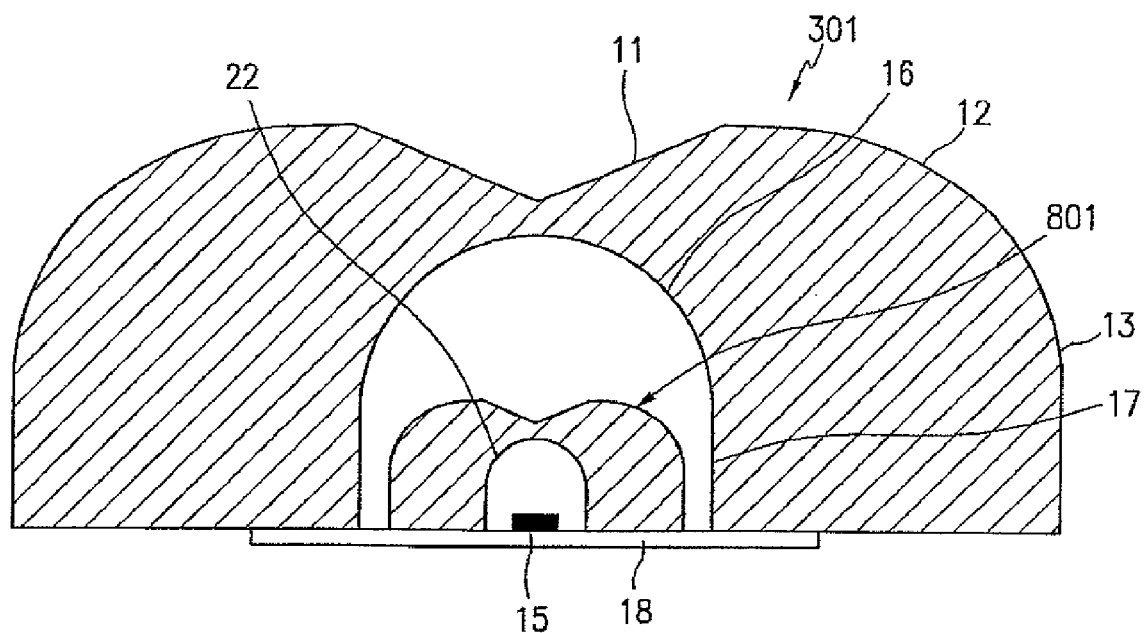

Referring to FIG. 24, an LED includes an outer lens 301 and an inner lens 801. The outer lens 301 has the same shape as the lens of the LED shown in FIG. 14. The inner lens 801 is provided in the central hollow portion of the outer lens 301 and has a central hollow portion 22 therein. A light emitting chip 15 is provided in the central hollow portion 22 of the inner lens 801. The inner lens 801 has the same shape as the lens of the LED shown in FIG. 14. That is, the inner lens 801 comprises an outer surface, an inner surface defining the central hollow portion 22, and a base. The outer surface of the inner lens 801 comprises a curved circumferential surface, a curved center-edge surface that satisfies the first condition of the radius of curvature or the first condition of light dispersion, and a curved centermost surface that satisfies Equation 1 relating to the condition that no total refraction is generated. The inner surface of the inner lens 801 comprises a curved circumferential surface and a curved central surface that satisfies the second condition of the radius of curvature or the second condition of light dispersion.

In the LED shown in FIG. 24, since the refraction is generated at the inner and outer surfaces of the inner lens, and at the inner and outer surfaces of the outer lens, the light ray is dispersed to a wider region.

The above-mentioned embodiments of the LED are examples, and more variations can be given. For example, the formation of the uneven pattern can be further varied.

Figure 25:
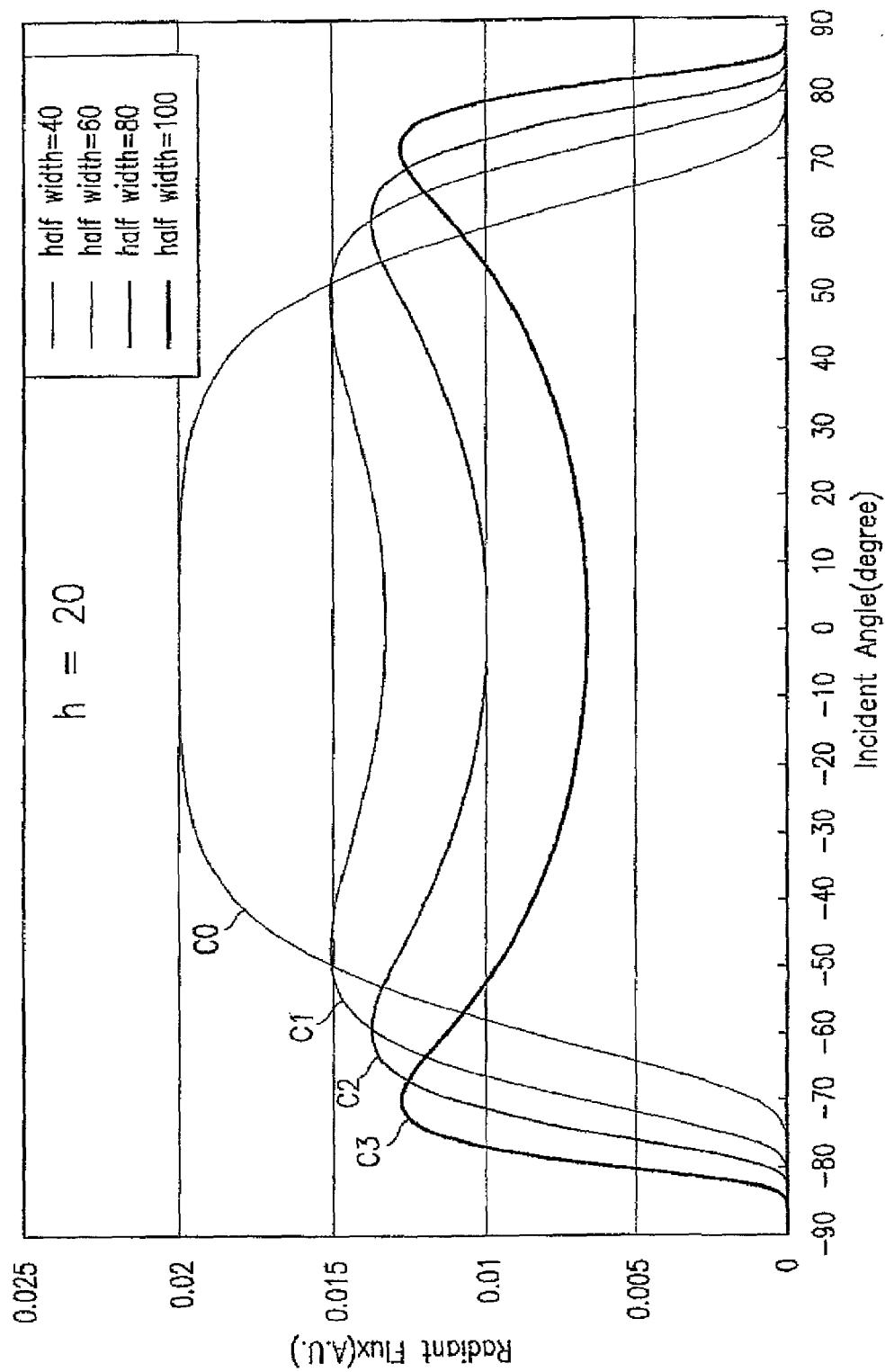
FIG. 25 is a graph showing flux to the incident angle of light rays emitted from LEDs according to embodiments of the present invention.

FIG. 25 is a graph showing the flux to the incident angle of the light ray from the LEDs according to embodiments of the present invention.

In FIG. 25, curve C0 is the flux to the incident angle of the light ray emitted from the LED shown in FIG. 4 and FIG. 5, curve C1 is the flux to the incident angle of the light ray emitted from the LED shown in FIG. 7 and FIG. 8, curve C2 is the flux to the incident angle of the light ray emitted from the LED shown in FIG. 11 and FIG. 12, and curve C3 is the flux to the incident angle of the light ray emitted from the LED shown in FIG. 4 and FIG. 5. The flux is measured at 20 mm above the LED.

As shown in FIG. 25, the dispersion of the light ray is enlarged in the order of the embodiment shown in FIG. 4 and FIG. 5, the embodiment shown in FIG. 7 and FIG. 8, the embodiment shown in FIG. 11 and FIG. 12, and the embodiment shown in FIG. 14.

As the incident angle of the light ray emitted from the LED increases, the RGB mixing section for producing the white light and the uniform dispersion section for producing the uniform surface light can be minimized.

Accordingly, an LED according to embodiments of the present invention can widen the three-dimensional incident angle, and thus the RGB mixing section for producing the white light and the uniform dispersion section for emitting the uniform surface light can be minimized. Such a property results in construction of a compact, slim, and light LCD.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed:

1. A lens for a light emitting diode formed from a material having a refractive index of n, the lens comprising a base; a first curved circumferential surface extending from the base; a curved center-edge surface extending from the first curved circumferential surface, and a curved centermost surface extending from the curved center-edge surface, wherein a distance from a center of the base to a point of the curved center-edge surface is shorter than a radius of curvature for the point of the curved center-edge surface, and wherein the curved centermost surface has a concave shape when viewed from the center of the base, wherein the lens includes a hollow portion formed from the base of the lens, wherein the hollow portion forms an inner surface of the lens and is comprised of a second curved circumferential surface and a curved central surface extending from the second curved circumferential surface, and wherein a distance from the center of the base to a point of the curved central surface is longer than a radius of curvature for the point of the curved central surface.

2. The lens of claim 1, wherein, when A1 is an obtuse angle formed between a main axis of the lens and a tangent line of a point on the curved centermost surface, and A2 is an acute angle formed between a straight line linking the center of the base to the point on the curved centermost surface and the main axis of the lens, $A1+A2<90+\sin^{-1}(1/n)$.

3. The lens of claim 1, wherein a main axis of the lens is intersected with a tangent line of a boundary point of the curved center-edge surface and the curved centermost surface at an angle of 90 degrees.

4. The lens of claim 1, wherein a boundary region of the curved center-edge surface and the first curved circumferential surface is positioned within about 20 degrees to about 50 degrees with respect to a center axis of the base.

5. The lens of claim 1, wherein the curved centermost surface forms a cone-shaped groove.

* * * * *